United States Patent
Saito et al.

(10) Patent No.: US 12,106,893 B2
(45) Date of Patent: Oct. 1, 2024

(54) COIL MODULE, ACTUATOR PROVIDED WITH COIL MODULE, AND METHOD FOR MANUFACTURING COIL MODULE

(71) Applicant: ROHM CO., LTD., Kyoto (JP)

(72) Inventors: Akihito Saito, Kyoto (JP); Isamu Nishimura, Kyoto (JP); Yoshihiro Sekimoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 366 days.

(21) Appl. No.: 17/438,868

(22) PCT Filed: Mar. 12, 2020

(86) PCT No.: PCT/JP2020/010721
§ 371 (c)(1),
(2) Date: Sep. 13, 2021

(87) PCT Pub. No.: WO2020/189477
PCT Pub. Date: Sep. 24, 2020

(65) Prior Publication Data
US 2022/0059266 A1  Feb. 24, 2022

(30) Foreign Application Priority Data
Mar. 19, 2019  (JP) .................. 2019-051036

(51) Int. Cl.
*H01F 41/04* (2006.01)
*H01F 5/00* (2006.01)
(Continued)

(52) U.S. Cl.
CPC .......... *H01F 41/041* (2013.01); *H01F 5/003* (2013.01); *H01F 5/06* (2013.01); *H01F 41/127* (2013.01); *H04N 23/54* (2023.01)

(58) Field of Classification Search
CPC .......... H01F 5/06; H01F 5/003; H01F 41/041; H01F 41/127; H01F 7/0289; H01F 7/066;
(Continued)

(56) References Cited

U.S. PATENT DOCUMENTS

2019/0364663 A1  11/2019  Yosui et al.

FOREIGN PATENT DOCUMENTS

JP  3-14022 Y2  3/1991
JP  7-274467 A  10/1995
(Continued)

OTHER PUBLICATIONS

Decision of Refusal received in the corresponding Japanese Patent application, Mar. 28, 2023, and machine translation (8 pages).
(Continued)

*Primary Examiner* — Mohamad A Musleh
(74) *Attorney, Agent, or Firm* — HSML P.C.

(57) ABSTRACT

A coil module includes a conductor layer, at least one element, and a sealing resin. The conductor layer is formed along a predetermined plane and includes a wiring portion and a helical-shaped coil portion. The at least one element is mounted on the wiring portion. The sealing resin covers the conductor layer and the at least one element. The sealing resin is integrally formed of a single type of resin material and has a predetermined thickness in a first direction perpendicular to the plane.

15 Claims, 17 Drawing Sheets

(51) Int. Cl.
*H01F 5/06* (2006.01)
*H01F 41/12* (2006.01)
*H04N 23/54* (2023.01)

(58) Field of Classification Search
CPC ........ H01F 27/40; H04N 23/54; H02K 33/16; H05K 1/16
See application file for complete search history.

(56) References Cited

FOREIGN PATENT DOCUMENTS

| | | | |
|---|---|---|---|
| JP | 2001-359251 A | 12/2001 | |
| JP | 2013-131642 A | 7/2013 | |
| JP | 2016-149411 A | 8/2016 | |
| JP | 2016192516 A * | 11/2016 | |
| JP | 6585912 B2 * | 10/2019 | |
| JP | 2019-219564 A | 12/2019 | |
| WO | WO-2011001812 A1 * | 1/2011 | ......... H01F 27/2823 |
| WO | WO-2018074104 A1 * | 4/2018 | ............. G01R 33/02 |
| WO | WO-2018159485 A1 * | 9/2018 | ............. H01L 23/12 |
| WO | WO-2018173666 A1 * | 9/2018 | ............. H05K 1/115 |

OTHER PUBLICATIONS

International Search Report issued in PCT/JP2020/010721, Jun. 16, 2020 (2 pages).
Office Action received in the corresponding Japanese Patent application, Oct. 4, 2022, and machine translation (9 pages).

* cited by examiner

COIL MODULE, ACTUATOR PROVIDED WITH COIL MODULE, AND METHOD FOR MANUFACTURING COIL MODULE

TECHNICAL FIELD

The present disclosure relates to a coil module. In particular, the present disclosure relates to a coil module suitable as a component of an actuator.

BACKGROUND ART

Conventionally, smart phones are installed with a camera module, for example. In a camera module, an actuator for driving the lens is used. An actuator, for example, is used to drive the image capturing lens for autofocus in the optical axis direction or drive an image capturing lens for hand shake correction in a direction perpendicular to the optical axis. Also, with the actuator, positioning can be sped up and the accuracy increased by detecting the position of the image capturing lens and performing feedback control based on the detection result. To implement image capturing lens driving by the actuator, an electromagnetic force (Lorentz force) induced by a combination of a permanent magnet and a coil, for example, is used. In this case, the actuator is provided with a permanent magnet and a coil module disposed opposing the permanent magnet. The coil module is provided with a coil, a position detection element, a driver for making a current flow through the coil, and the like.

An example of a coil module used in an actuator for a camera module is described in Patent Document 1. This known coil module is provided with a planar coil and an IC chip. In this coil module, the planar coil is embedded in an insulating layer made of a thermosetting resin (epoxy resin or the like), and this planar coil and the IC chip are mounted on a flexible substrate. However, regarding separately mounting a planar coil and an IC chip on a flexible substrate, there is still room of improvement in terms of component handling, and increasing the accuracy of the positioning of the planar coil and the IC chip relative to one another is relatively difficult.

Furthermore, in the coil module described in Patent Document 1, an inner insulating layer is provided inside the insulating layer (made of an epoxy resin, for example) described above. This inner insulating layer is constituted by a flexible film made of imide or aramid. Also, the flexible substrate is made of polyimide, for example. Various resin materials (epoxy, imide, aramid, polyimide, and the like) are used in the coil module of the Patent Document 1. However, these resin materials have different thermal expansion coefficients. Thus, the coil module is susceptible to warpage when influenced by temperature change.

PRIOR ART DOCUMENTS

Patent Document

Patent Document 1: JP 2013-131642A

SUMMARY OF THE INVENTION

Problem to be Solved by the Invention

In light of the foregoing, the present disclosure is directed at providing a coil module in which handling of components is improved and that is suitable for use as a component of an actuator. Also, the present disclosure is also directed at providing a coil module capable of suppressing warpage caused by temperature change.

Means for Solving the Problem

A coil module provided according to an aspect of the present disclosure includes: a conductor layer formed along a predetermined plane and including a wiring portion and a helical-shaped coil portion; at least one element mounted on the wiring portion; and a sealing resin configured to cover the conductor layer and the at least one element, where the sealing resin is integrally formed of a single type of resin material and has a predetermined thickness in a first direction perpendicular to the plane.

Advantages of the Invention

According to the configuration described above, handling of components can be improved, and the positional relationship between the coil portion and the element can be maintained with high accuracy. Also, because the sealing resin is integrally formed using a single type of resin material, warpage caused by temperature change can be suppressed.

Other features and advantages of the present disclosure will be apparent from the following detailed description with reference to the attached diagrams.

MODE FOR CARRYING OUT THE INVENTION

Preferable embodiments of the present disclosure will be described below in detail with reference to the drawings. The same or similar components, members, and processes in the diagrams are given the same reference sign, and redundant descriptions are omitted as appropriate. In the present specification, "(a state where) member A is connected to member B" includes in its meaning that the member A and the member B are able to be connected directly and also that the member A and the member B are able to be connected indirectly via another member, for example.

First Embodiment

Figure 1:
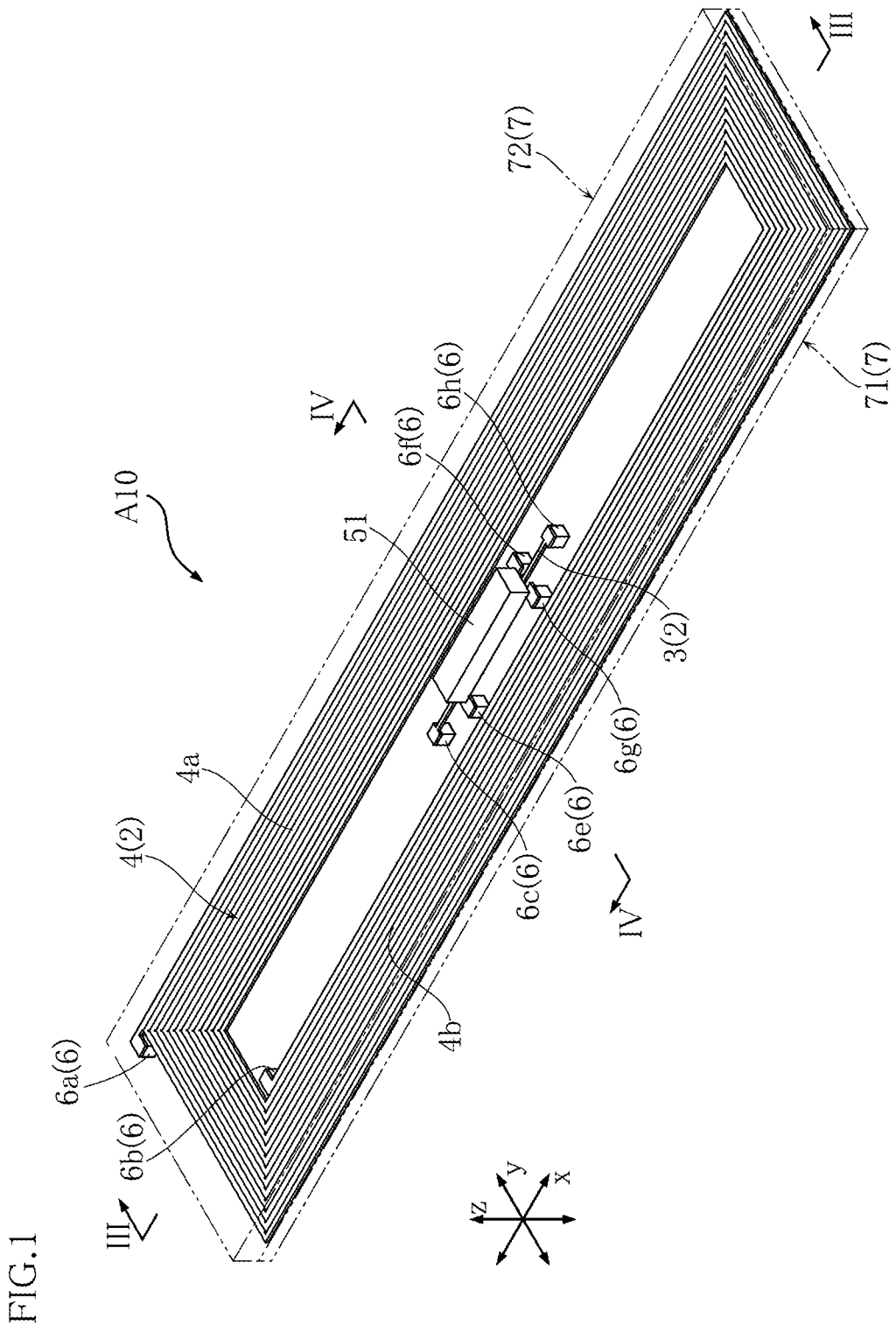
FIG. 1 is a perspective view illustrating a coil module according to a first embodiment.
Figure 2:
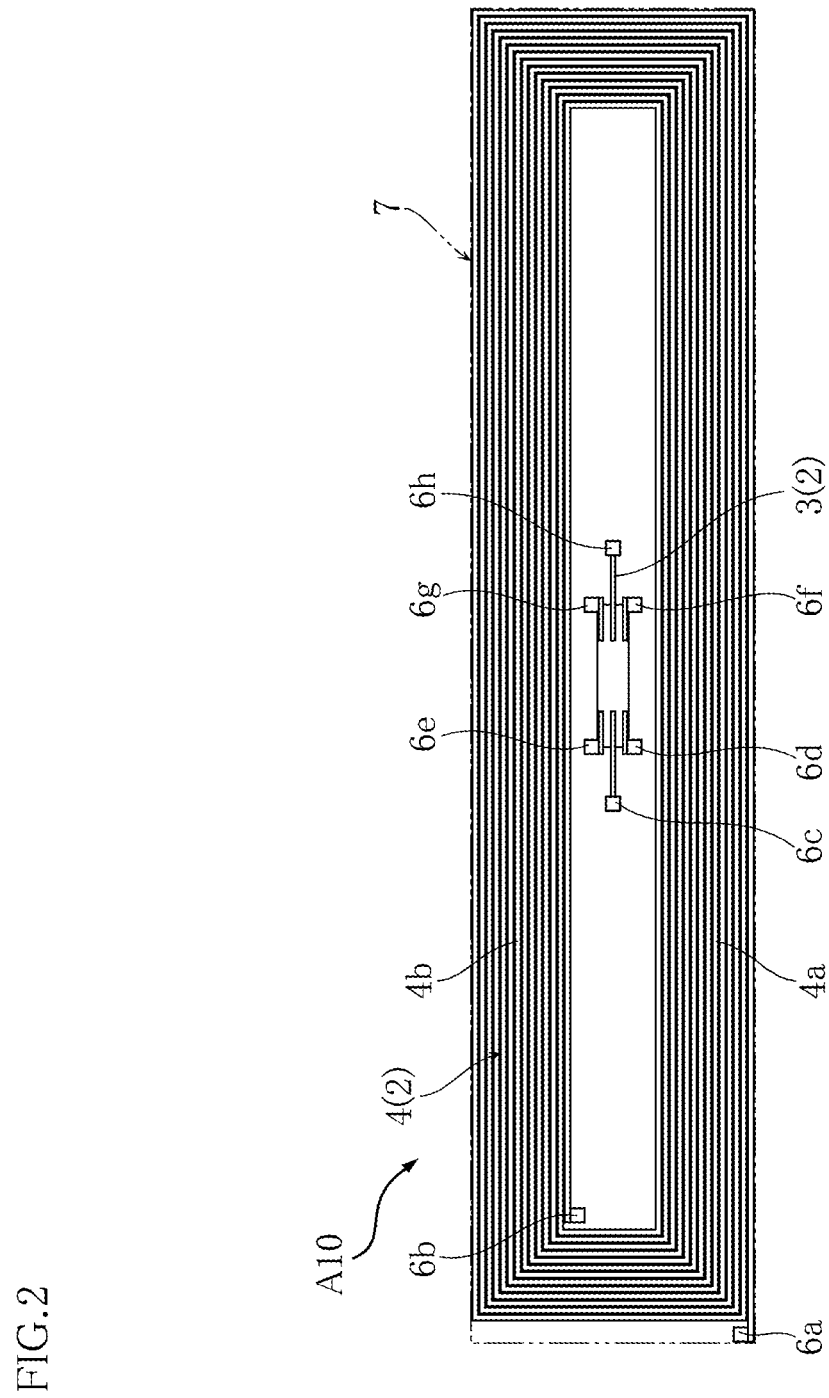
FIG. 2 is a bottom view of the coil module illustrated in FIG. 1.
Figure 3:
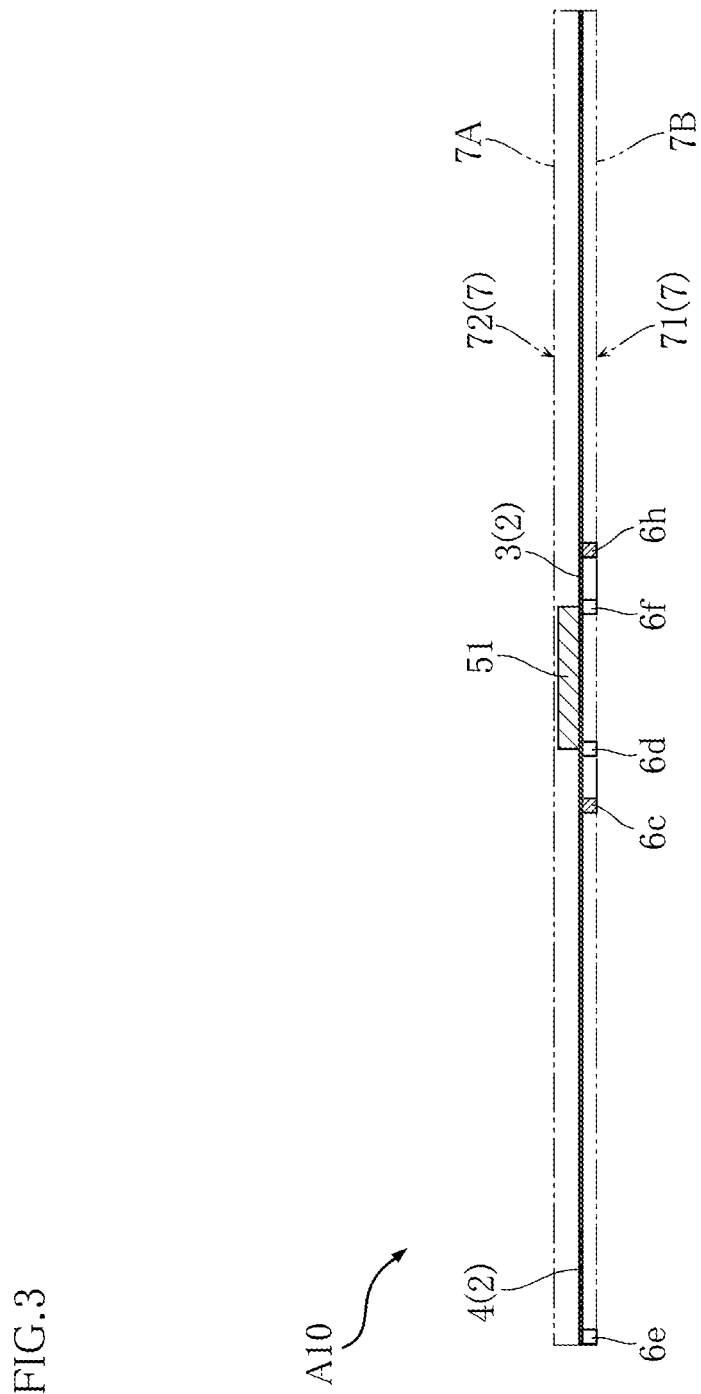
FIG. 3 is a cross-sectional view taken along line III-III of FIG. 1.
Figure 4:
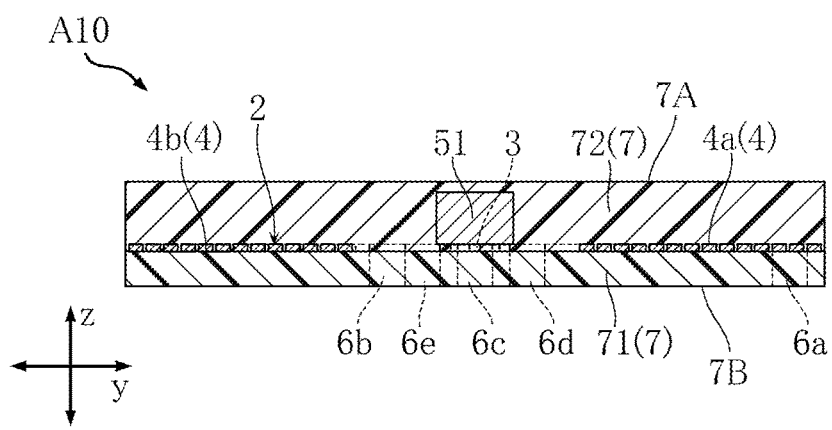
FIG. 4 is a cross-sectional view taken along line IV-IV of FIG. 1.
Figure 5:
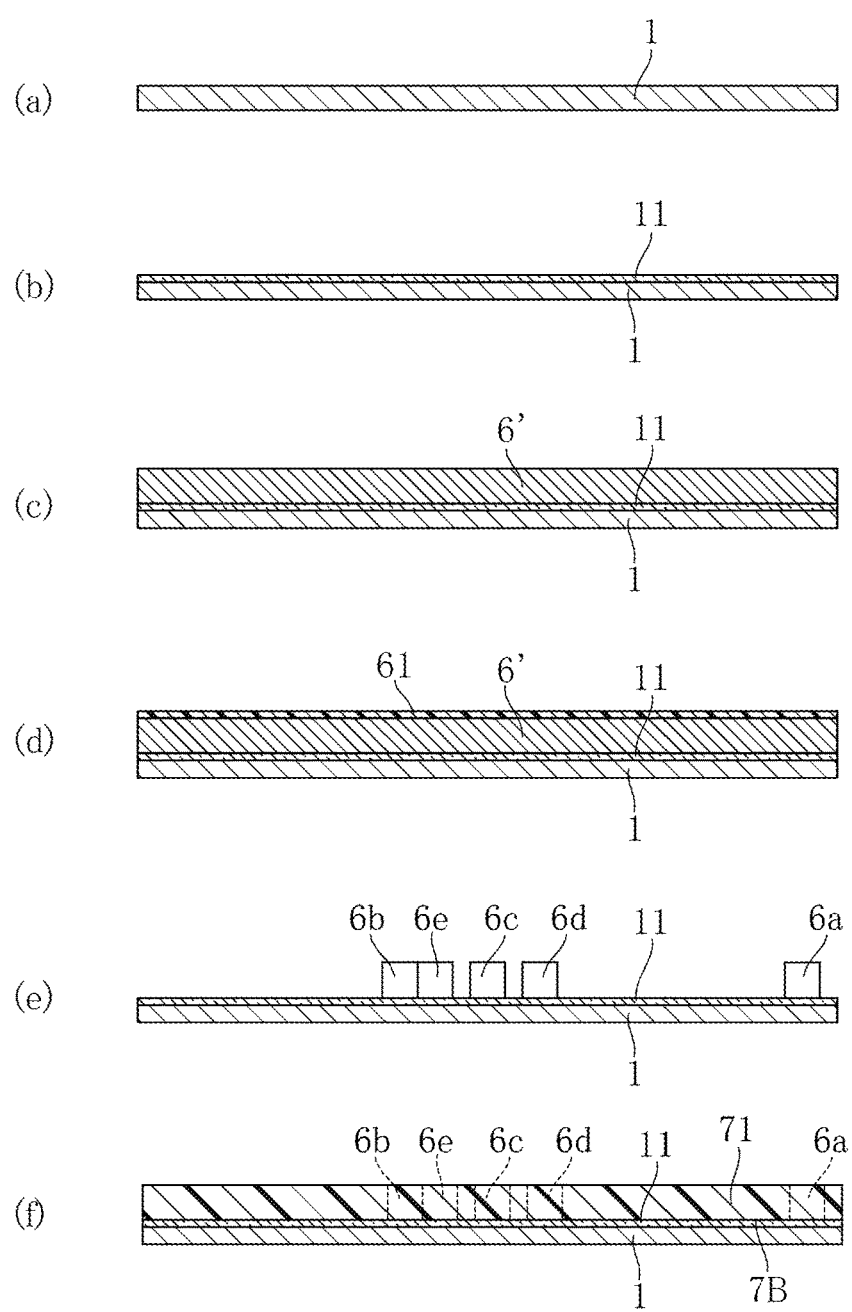
FIG. 5 illustrates, in cross-sectional view, the processes of the method of manufacturing the coil module illustrated in FIG. 1.

A coil module A10 according to the first embodiment will now be described with reference to FIGS. 1 to 4. FIG. 1 is a perspective view illustrating the general configuration of the coil module A10. FIG. 2 is a bottom view of the coil module A10. FIG. 3 is a cross-sectional view taken along line III-III of FIG. 1. FIG. 4 is a cross-sectional view taken along line IV-IV of FIG. 1.

The coil module A10 includes a conductor layer 2, an element 51, a plurality of terminal portions 6, and a sealing resin 7 that integrally packages the conductor layer 2, the element 51, and the plurality of terminal portions 6. In the illustrated example, the element 51 is a driver IC. In the diagrams, the plurality of terminal portions 6 are differentiated via an appended letter. In the coil module A10, the plurality of terminal portions 6a to 6h are provided. In FIGS. 1 to 3, to facilitate understanding, the sealing resin 7 is made transparent (see the two-dot chain line). In the FIGS. 7 to 9, FIG. 11, FIG. 13, FIG. 14, FIG. 19, and FIG. 20 described below also, the sealing resin 7 is illustrated by a two-dot chain line.

When used, the coil module A10 is disposed opposing a magnetic field generator, for example, thus making it suitable as a component of an actuator. The magnetic field generator is a permanent magnet, for example. The illustrated coil module A10 is a rectangular parallelepiped, but the present disclosure is not limited thereto. For example, the size of the coil module A10 is from approximately 3 to 6 mm on the long side (the side extending in a direction x), from approximately 1.5 to 2.5 mm on the short side (the side extending in a direction y), and from approximately 1 to 2 mm in thickness (dimension in a direction z). In the present specification, the direction z is referred to as the "thickness direction" as appropriate. Also, "as viewed in the direction z (as seen from the thickness direction)" may be referred to as "in a plan view".

The sealing resin 7 defines the external shape of the coil module A10 and covers the conductor layer 2 and the driver IC 51. The sealing resin 7 is rectangular and includes a top surface 7A and a bottom surface 7B. The top surface 7A and the bottom surface 7B face opposite one another in the direction z.

The sealing resin 7 is an integrally formed by a single type of resin material. In the illustrated example, the sealing resin 7 includes a first sealing resin 71 and a second sealing resin 72. The first sealing resin 71 and the second sealing resin 72 are made of the same type of resin material and are overlayed on one another in the direction z. The first sealing resin 71 includes the bottom surface 7B, and the second sealing resin 72 includes the top surface 7A.

The sealing resin 7 (the first sealing resin 71 and the second sealing resin 72) may be a transparent resin or an opaque resin. The material of the sealing resin 7 is not particularly limited and may be an epoxy resin, for example.

The conductor layer 2 includes at least one wiring portion 3 and a coil portion 4. The conductor layer 2 is formed along the x-y plane direction. In the example illustrated in FIG. 4, the conductor layer 2 is formed via patterning on the first sealing resin 71. The wiring portion 3 and the coil portion 4 are formed in the same layer.

As illustrated in FIGS. 1 and 2, the coil portion 4 is formed in a rectangular, helical-shaped pattern. The coil portion is formed in a region roughly a constant width from the peripheral edge of the sealing resin 7 or the peripheral edge region, and is not formed in the central rectangle region elongated in the direction x. In the illustrated example, a plurality of the wiring portions 3 are provided, and the driver IC 51 is mounted on the wiring portions 3. The plurality of wiring portions 3 constitute a current path for input and output to and from the driver IC 51. The plurality of wiring portions 3 are disposed inward from the coil portion 4 as viewed in the direction z. The number of wiring portions 3 is set depending on the number of terminals of the driver IC 51, for example.

The driver IC 51 is an integrated circuit with a built-in magnetic detection element (a Hall element, for example). The driver IC 51 is configured to detect the strength of the magnetic field (magnetic flux density) passing through the magnetic detection element and supply a current to the coil portion 4. The driver IC 51 is disposed inward from the coil portion 4 as viewed in the direction z.

In the example illustrated in FIG. 1, the driver IC 51 has an elongated chip shape. The driver IC 51 being disposed inward from the coil portion 4 allows the internal space of the coil module A10 to be effectively utilized.

In a case where the coil module A10 is used as a component constituting an actuator, the relative difference in position to the magnetic field generator is detected by the magnetic detection element of the driver IC 51, and feedback is made via a signal obtained by the detection. The movable portion of the actuator is driven to achieve the desired relative displacement on the basis of the signal (feedback signal). Specifically, on the basis of the feedback signal, the driver IC 51 supplies a predetermined amount of current to the coil portion 4. As illustrated in FIG. 2, the coil portion 4 includes two portions that extend in the longitudinal direction, i.e., a first portion 4a and a second portion 4b. The magnetic flux in different directions (magnetic flux in different directions in a plane including the coil portion 4, for example) generated from the magnetic field generator passes through the first portion 4a and the second portion 4b. In this state, when a current is applied to the coil portion 4, a Lorentz force is generated by the combined effects of the magnetic flux and the current. This is the drive power of the actuator.

In the present embodiment, the plurality of terminal portions 6a to 6h are each electrically connected with one of the wiring portions 3 or the coil portion 4. Each terminal portion 6a to 6h pass through the first sealing resin 71 in the direction z from the wiring portion 3 or the coil portion 4 (see FIG. 4). The terminal portions 6a, 6b are provided on the two ends of the coil portion 4. The terminal portions 6c to 6h are provided for the respective wiring portions 3. In the example illustrated in the diagram, there are six wiring portions 3 that are connected to the respective terminal portion 6c to 6h (in FIG. 1, the terminal portion 6d is hidden behind the driver IC 51) at one end. The other ends of the wiring portions 3 are connected to terminals of the driver IC 51. The wiring portions 3 and the driver IC 51 can be connected using solder bumps or metal bumps (not illustrated) in a self-alignment manner utilizing the surface tension of the molten metal, allowing for highly accurate positioning.

Of the six terminal portions 6c to 6h, four terminal portions (for example, terminal portions 6d, 6e, 6f, 6g) are terminals for power supply, ground, clock, and signal, and the remaining two terminal portions (for example, the terminal portions 6c, 6h) are connected to the terminal portions 6a, 6b of the coil portion 4. For example, in a case where the terminal portion 6a and the terminal portion 6c are connected and the terminal portion 6b and the terminal portion 6h are connected, the terminal portions may be connected inside the coil module A10. However, in this case, in order to connect the terminal portion 6a and the terminal portion 6c, the connection needs to be made across the pattern of the coil portion 4, and therefore the pattern needs to be multi-layered via an insulating layer. In a case of a non-multilayer structure, the terminal portion 6a and the terminal portion 6c may be connected via a wiring pattern inside the flexible substrate of the actuator mounted with the coil module A10.

Each of the terminal portions 6a to 6h are covered with the sealing resin 7 (first sealing resin 71) for the majority of the portion except for the ends. The ends of the terminal portions 6a to 6h are exposed on the bottom surface 7B side of the sealing resin 7. In the sealing resin 7, the surface (bottom surface 7B) where the terminal portions 6a to 6h are exposed corresponds to the mounting surface for mounting on the flexible substrate of the actuator side, for example. The magnetic field generator such as a permanent magnet is disposed opposing the surface (top surface 7A) on the opposite side to the mounting surface for mounting on the flexible substrate.

An example of the method of manufacturing the coil module A10 is described next with reference to FIGS. 5(a) to 5(f) and 6(a) to 6(e). Note that the cross-section illustrated in FIGS. 5(a) to 5(f) and 6(a) to 6(e) is taken along the y-z plane along line IV-IV of FIG. 1.

Firstly, a substrate material 1 is prepared as illustrated in FIG. 5(a). The substrate material 1 corresponds to a base used when forming the layers of a conductive layer 6' and a conductor layer 2' described below and the first sealing resin 71 and the second sealing resin 72 and is ultimately removed. The substrate material 1 is made of a semiconductor material such as silicon (Si). The material of the substrate material 1 may be a semiconductor material other than silicon. However, silicon is advantageous from a material cost perspective. The silicon may be single-crystal or amorphous. The thickness of the substrate material 1 may be selected as appropriate taking into account strength and cost. However, because ultimately the substrate material 1 is removed, a thinner substrate material 1 produces less waste. The thickness of the substrate material 1 is approximately 50 μm, for example. The substrate material 1 is a size capable of accommodating a plurality of the coil modules A10. In the manufacture method described below, a plurality of the coil modules A10 are manufactured in a batch. However, no such limitation is intended, and the method used may manufacture a single coil module A10.

Next, as illustrated in FIG. 5(b), an insulating layer 11 made of an oxide film ($SiO_2$), for example, is formed on the surface of the substrate material 1. The insulating layer 11 is formed by oxidizing the entirety of the surface on one side of the substrate material 1. Regarding the formation of the insulating layer 11, a nitride film may be used instead of the oxide film. The thickness of the insulating layer 11 is approximately 1 μm, for example.

Next, the conductive layer 6' is formed as illustrated in FIG. 5(c). Specifically, the layer made of Cu, for example, is formed by sputtering on the insulating layer 11. Before the conductive layer 6' is formed, a barrier sheet layer made of Ti, for example, may be formed as an underlayer.

Next, a mask layer 61 is formed as illustrated in FIG. 5(d). The mask layer 61 is formed by spray coating a photosensitive resist resin, for example.

Next, patterning is performed as illustrated in FIG. 5(e). In the patterning, for example, exposure and development using photolithography is performed to remove the unnecessary pattern of the mask layer 61. Furthermore, the portion of the conductive layer 6' not protected by the mask layer 61 is removed via etching. Then, the now unnecessary mask layer 61 is removed via etching. In this manner, the terminal portions 6a to 6h with a desired shape are formed.

Next, the first sealing resin 71 is formed as illustrated in FIG. 5(f). The first sealing resin 71 is formed by layering, on the substrate material 1, a resin material with excellent permeability that cures via exposure to light, for example, and curing the resin material. The first sealing resin 71 is formed covering the surface of the substrate material 1 and the periphery of the terminal portions 6a to 6h. The surface of the first sealing resin 71 in contact with the substrate material 1 corresponds to the bottom surface 7B. The ends of the terminal portions 6a to 6h are exposed from the first sealing resin 71. In a case where the ends of the terminal portions 6a to 6h are not exposed after the first sealing resin 71 is formed, grinding can be used to expose the ends of the terminal portions 6a to 6h.

Next, the conductor layer 2' is formed as illustrated in FIG. 6(a). The conductor layer 2' is made of Cu, for example, and is formed into the wiring portions 3 and the coil portion 4 by patterning. The conductor layer 2' is electrically connected to the terminal portions 6a to 6h exposed from the first sealing resin 71.

Next, patterning is performed on the conductor layer 2'. In the patterning of the conductor layer 2', processes including resist coating, exposure, development, conductor layer etching, residual resist removal, and the like are performed as appropriate. In this manner, the conductor layer 2 (the wiring portions 3 and the coil portion 4) is formed with the desired shape as illustrated in FIG. 6(b).

Next, the driver IC 51 is mounted on the wiring portions 3 as illustrated in FIG. 6(c). Here, the wiring portions 3 and the driver IC 51 are connected via bumps (not illustrated) on the rear surface side of the driver IC 51. By using solder bumps or metal bumps as the bumps and performing self-alignment utilizing the surface tension, highly accurate positioning can be achieved.

Next, the second sealing resin 72 is formed as illustrated in FIG. 6(d). The second sealing resin 72 is formed using the same type of resin material used for the first sealing resin 71. The second sealing resin 72 is formed on the first sealing resin 71. The second sealing resin 72 is formed covering the conductor layer 2 (the wiring portions 3 and the coil portion 4) and the entirety of the driver IC 51. By forming a package by performing sealing using a single type of resin material (the first sealing resin 71 and the second sealing resin 72), deformations and warpage in the package caused by a difference in the thermal expansion coefficient can be reduced. Also, at this stage, the substrate material 1 with high strength remains, which can help suppress the effects of contraction when the resin is cured.

Figure 6:
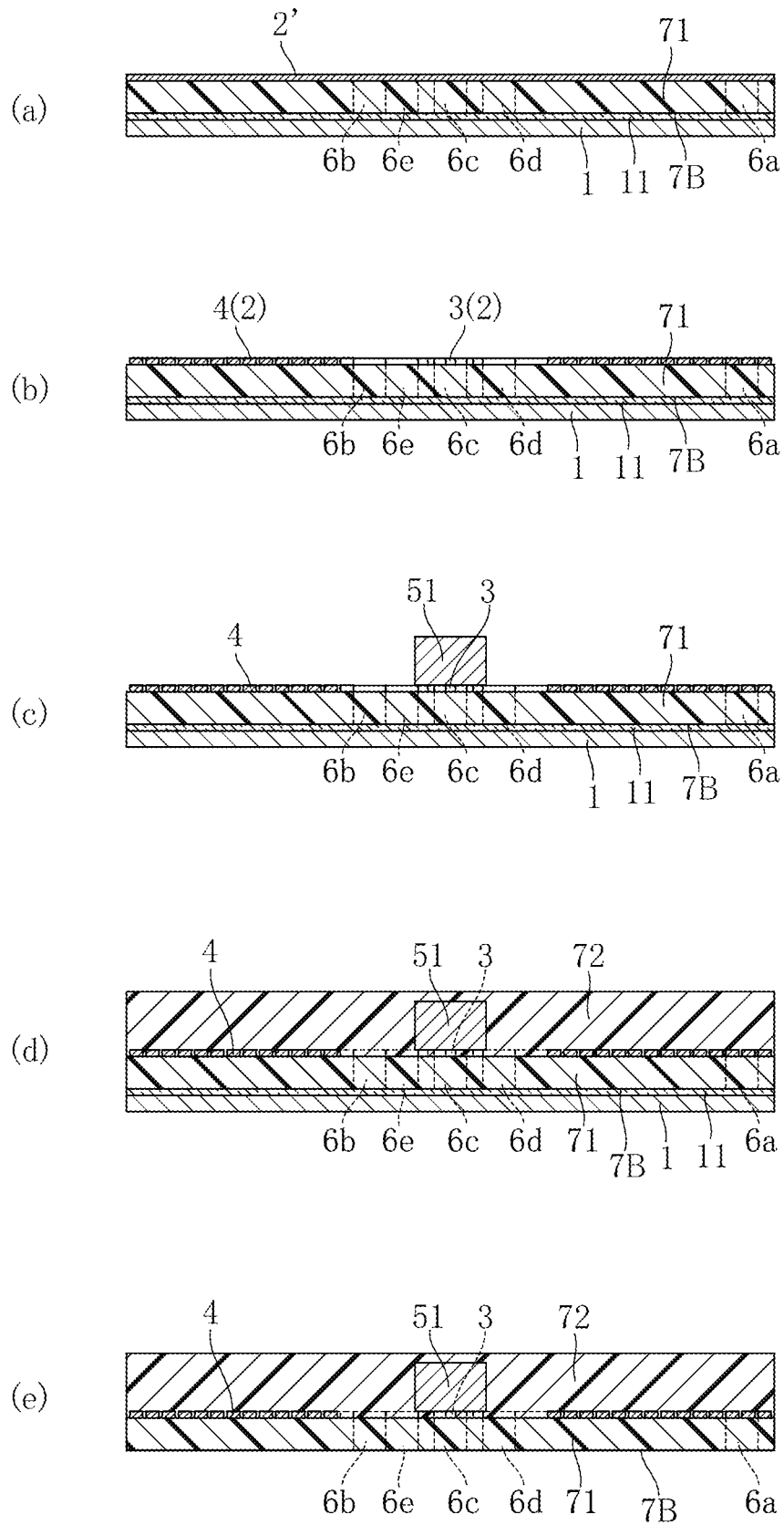
FIG. 6 illustrates, in cross-sectional view, other processes of the method of manufacturing.

Next, the substrate material 1, i.e., the base, is removed as illustrated in FIG. 6(*e*). Here, the substrate material 1 (including the insulating layer 11) is removed by grinding, for example, exposing the bottom surface 7B of the first sealing resin 71. After the substrate material 1 is removed, the ends of the terminal portions 6*a* to 6*h* are exposed from the bottom surface 7B side of the first sealing resin 71.

Next, package structure including the integrally formed first sealing resin 71 and second sealing resin 72 are cut (dicing process) into a number of pieces by a dicer (not illustrated) as appropriate. By dicing, a number of pieces of the coil module A10 illustrated in FIGS. 1 to 4 are obtained. The shape of the coil modules A10 cut into a number of pieces by dicing is rectangular in a plan view, for example.

Next, the effects of the coil module A10 and the manufacturing method thereof will be described.

In the coil module A10 of the present embodiment, the coil portion 4 (that generates a drive power when a current is applied to it) and the driver IC 51 (that includes a built-in magnetic detection element and supplies a current to the coil portion 4 are integrally packaged via the sealing resin 7. According to this configuration, handling is excellent compared to a case in which a coil and an element are separately mounted on the flexible substrate. Accordingly, in a case where the coil module A10 is a component of an actuator, the coil module A10 can be disposed at the desired position with high accuracy. Also, because the coil portion 4 and the wiring portions 3 for mounting the driver IC 51 are formed via patterning in the same layer, the accuracy of positioning the coil portion 4 and the driver IC 51 in the coil module A10 can be increased.

In the coil module A10 of the present embodiment, the coil portion 4 and the driver IC 51 are sealed and packaged using a single type of resin material. Thus, warpage in the package caused when using different resin materials can be minimized or prevented.

The driver IC 51 is disposed inside of the coil portion 4 as viewed in the direction z. According to this configuration, the space inside of the coil portion 4 is not wasted, and an elongated chip-like element such as the driver IC 51 can be efficiently disposed.

Furthermore, when the coil module A10 is manufactured, until the stage where the sealing resin 7 is formed, the substrate material 1 remains as a base. In a case where the substrate material 1 is silicon, compared to polyimide that is widely used as the material for the flexible substrate, the coefficient of linear thermal expansion is approximately one fifth, the elastic modulus is approximately 40 times greater, and the thermal conductivity is approximately 500 times greater. Thus, the substrate material 1 is resistant to deformation and warpage. In this manner, though there is a small possibility of contraction when the resin is cured to form the sealing resin 7, by using the manufacturing method including forming the sealing resin 7 (the first sealing resin 71 and the second sealing resin 72) on the substrate material 1, contraction strain in the sealing resin 7 when the resin is cured can be reduced.

In the present embodiment, the plurality of terminal portions 6 (6*a* to 6*h*) include one end exposed on the bottom surface 7B side of the sealing resin 7. When manufacturing the coil module A10, the terminal portions 6*a* to 6*h* are formed on the substrate material 1, and the first sealing resin 71 is formed on the substrate material 1 covering the terminal portions 6*a* to 6*h*. The surface of the first sealing resin 71 in contact with the substrate material 1 corresponds to the bottom surface 7B. After the substrate material 1 is finally removed, the bottom surface 7B is exposed, forming the mounting surface for mounting to the flexible substrate. According to this configuration, the plurality of terminal portions 6 (6*a* to 6*h*) for electrical connection to the outside can be formed relatively easily.

Second Embodiment

Figure 7:
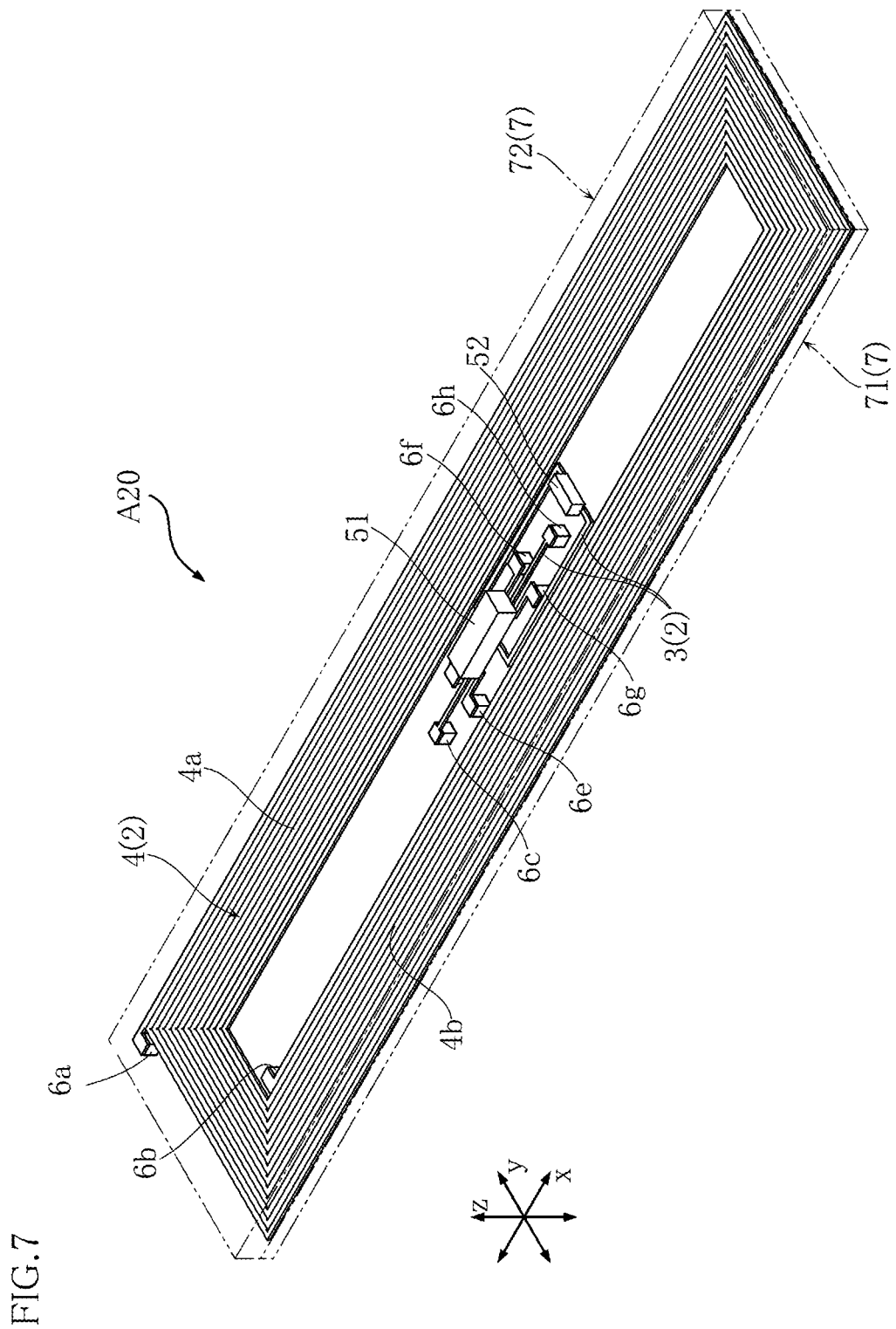
FIG. 7 is a perspective view illustrating a coil module according to a second embodiment.

A coil module A20 according to the second embodiment will now be described with reference to FIG. 7. The coil module A20 is different from the coil module A10 described above in that an additional element (chip capacitor) 52 is provided. Apart from this, the configuration is the same as that of the coil module A10, and thus a detailed description is omitted.

The chip capacitor 52 is for stabilizing the voltage supplied to the driver IC 51. The chip capacitor 52 is mounted on the wiring portion 3 near the driver IC 51. The chip capacitor 52 is preferably provided near an element that handles a large current such as the driver IC 51.

In the wiring portions 3, a pattern for connecting the driver IC 51 and the chip capacitor 52 is added, with the chip capacitor 52 being connected to the wiring portions 3 in parallel between the power supply voltage and the ground, for example. In FIG. 7, the two ends of the chip capacitor 52 are connected to terminals of the driver IC 51, but may be connected to a power supply terminal and a ground terminal of the terminal portions 6.

In the coil module A20, the driver IC 51 and the chip capacitor 52 are both mounted, and the driver IC 51 and the chip capacitor 52 are connected inside the coil module A20. In this manner, the power supply voltage of the driver IC 51 can be stabilized without providing an external chip capacitor.

Third Embodiment

Figure 8:
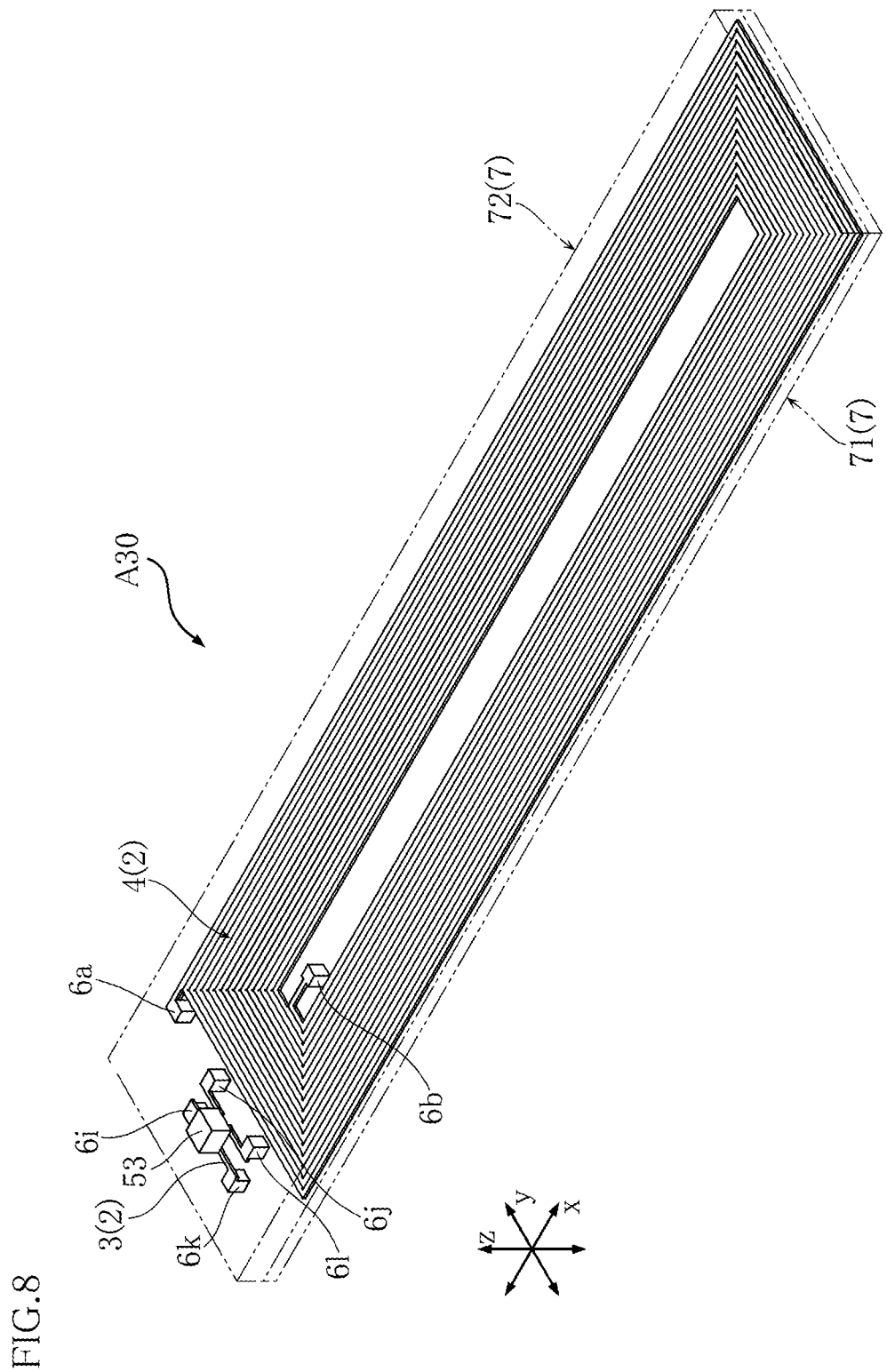
FIG. 8 is a perspective view illustrating a coil module according to a third embodiment.

A coil module A30 according to the third embodiment will now be described with reference to FIG. 8. The coil module A30 is different from the coil module A10 described above in terms of mainly the configuration and arrangement of the element.

The coil portion 4 is formed in a rectangular, helical-shaped pattern in a similar manner to the coil module A10. However, the coil portion 4 is formed in a region excluding one end portion (the upper left portion in the diagram) of the coil module A30 in the longitudinal direction (direction x). In the present embodiment, a Hall element 53 is disposed outward from the coil portion 4 as viewed in the direction z.

In the present embodiment, the pattern of the wiring portion 3 extends in the lateral direction (direction y) of the coil module A30. Accordingly, when the elongated driver IC 51 is mounted in the lateral direction, the wiring portion 3 may be unable to fit in the length area in the lateral direction. Thus, in the present embodiment, the Hall element 53 is employed as the magnetic detection element. If space is sufficient, the driver IC 51 with a built-in magnetic detection element may be mounted instead of the Hall element 53.

The Hall element 53 is mounted above the wiring portion 3. There are four wiring portions 3 (some of them not illustrated), with terminal portions 6*i* to 6*l* provided on the ends of the wiring portions 3. The other end of each one of the wiring portions 3 is connected to a terminal of the Hall element 53. Of the four terminal portions 6i to 6l, two are connected to a bias terminal of the Hall element 53 and the remaining two are connected to an output terminal of the Hall element 53. A driver that supplies a bias current to the Hall element 53 and supplies a drive current to the coil portion 4 is connected outside of the coil module A30. The coil module A30 and the driver are connected via the wiring pattern inside the flexible substrate of the actuator, for example.

The purpose of disposing the Hall element 53 (magnetic detection element) on the outer side of the coils of the coil portion 4 as in the coil module A30 is to reduce the leakage to the magnetic detection element of the magnetic field generated by a current being applied to the coil portion 4. The magnetic field generated by a current being applied to the rectangular coil portion 4 is likely to be strong on the inner side of the coils of the coil portion 4, with the magnetic flux from the four side lines converging here. On the other hand, at positions on the outer side of the coils of the coil portion 4, the magnetic flux from one side line of the coil portion 4 is predominant, meaning that the magnetic flux is less here than at positions on the inner side of the coils of the coil portion 4. Thus, according to the coil module A30, magnetic field noise from the coil portion 4 entering to the Hall element 53 can be reduced.

Fourth Embodiment

Figure 9:
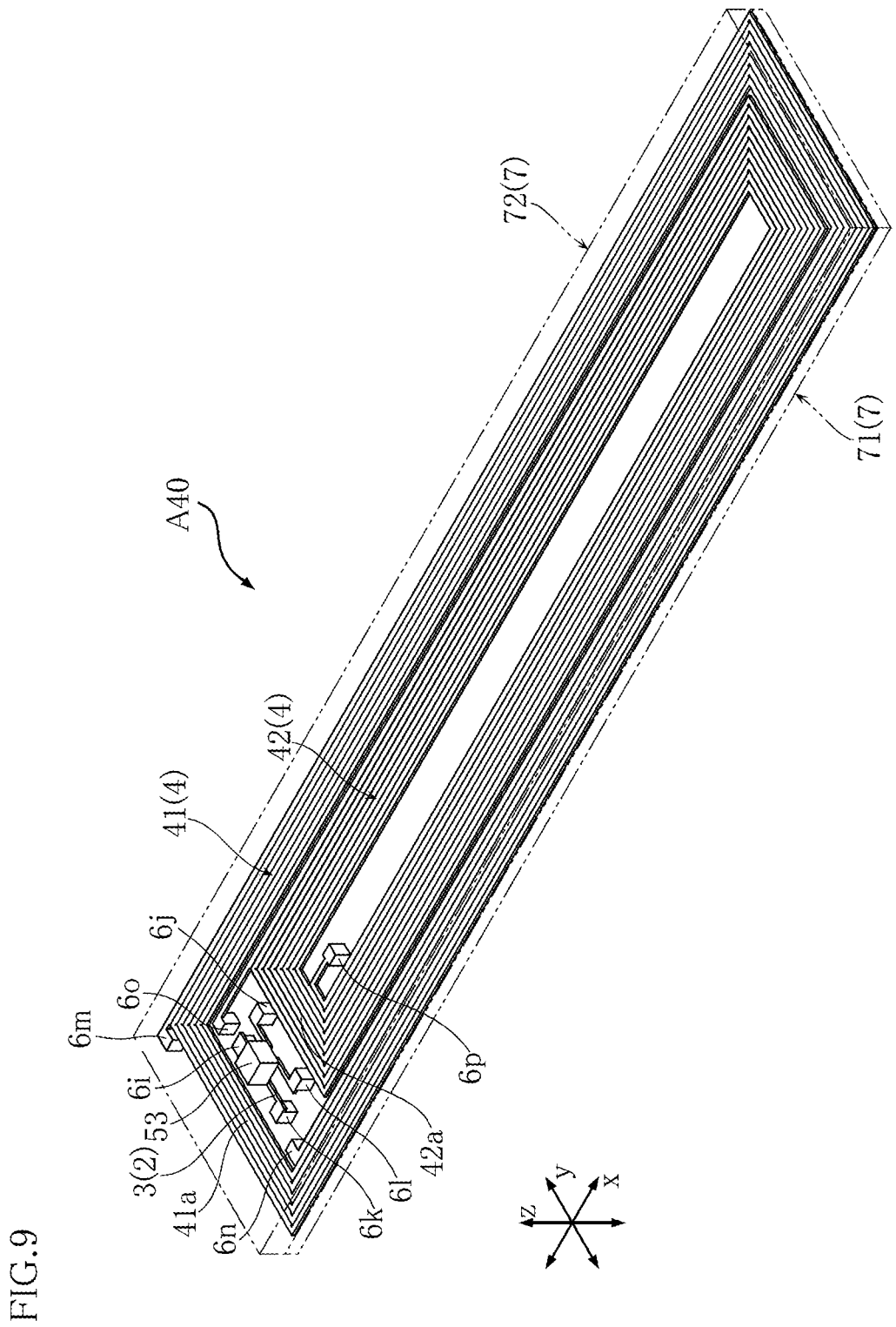
FIG. 9 is a perspective view illustrating a coil module according to a fourth embodiment.
Figure 10:
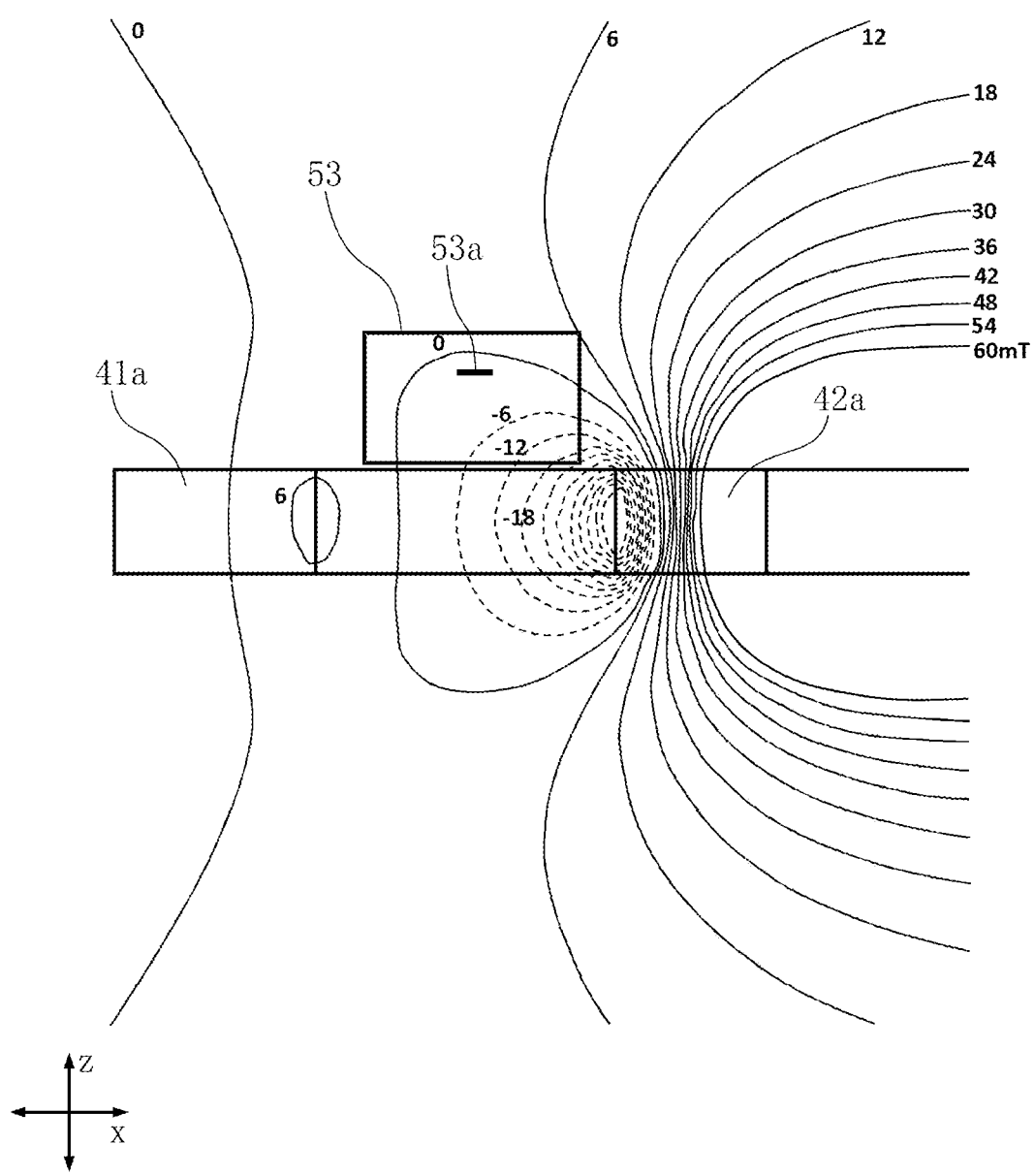
FIG. 10 is a diagram illustrating the distribution of the magnetic flux density in the periphery of the magnetic detection element of the coil module illustrated in FIG. 9.

A coil module A40 according to the fourth embodiment will now be described with reference to FIGS. 9 and 10. FIG. 9 is a perspective view illustrating the general configuration of the coil module A40. FIG. 10 is a diagram illustrating the density distribution of the magnetic flux generated by a current being applied to the coil in the periphery of the magnetic detection element. The coil module A40 is different from the coil module A30 described above in terms of mainly the configuration of the coil portion 4 and the arrangement of the Hall element 53.

In the present embodiment, the coil portion 4 has a dual structure including an outer coil 41 and an inner coil 42. The outer coil 41 is formed near the peripheral edge of the sealing resin 7. The inner coil 42 is formed inward from the coil of the outer coil 41 as viewed in the direction z. The Hall element 53 is disposed inward from the coil of the outer coil 41 and outward from the coil of the inner coil 42 as viewed in the direction z. If space is sufficient, the driver IC 51 with a built-in magnetic detection element may be mounted instead of the Hall element 53.

In the present embodiment, four wiring portions 3 are formed, and the Hall element 53 is mounted above the wiring portions 3. The configuration of the wiring portions 3 and the terminal portions 6i to 6l provided on the ends thereof is the same as that of the coil module A30.

In the present embodiment, a plurality of terminal portions 6m, 6n, 6o, 6p are provided connected to the coil portion 4. Specifically, the terminal portions 6m, 6n are provided on the two ends of the outer coil 41. The terminal portions 6o, 6p are provided on the two ends of the inner coil 42. The four terminal portions 6i to 6l connected to the Hall element 53 and the four terminal portions 6m to 6p connected to the coil portion 4 are connected to the flexible substrate of the actuator. The outer coil 41 and the inner coil 42 are connected in series via the wiring pattern inside the flexible substrate, for example. However, the present disclosure is not limited thereto, and the structure for connecting the outer coil 41 and the inner coil 42 may be selected as appropriate. In a case where the amount of current applied to the outer coil 41 and the amount of current applied to the inner coil 42 is desired to be different, the outer coil 41 and the inner coil 42 may be connected in parallel.

The purpose of disposing the Hall element 53 (magnetic detection element) on the inner side of the coils of the outer coil 41 and on the outer side of the coils of the inner coil 42 is to prevent the magnetic field generated by a current being applied to the coil portion 4 entering to the magnetic detection element and becoming noise. In a case where a current is applied in the same direction to the outer coil 41 and the inner coil 42 of the dual structure formed in individual coils, due to the outer coil 41 and the inner coil 42, a magnetic field in the opposite direction passes through the Hall element 53 (magnetic detection element) disposed as in FIG. 9. Thus, by adjusting the number of coils of the outer coil 41 and the inner coil 42 or the current applied to the coils so that the strength of the magnetic fields are substantially the same, the magnetic fields passing through the Hall element 53 cancel out one another, allowing noise to be reduced.

FIG. 10 is a diagram schematically illustrating the density distribution of the magnetic flux generated by a current being applied to the coil at a central cross-section near the Hall element 53 (magnetic detection element). In FIG. 10, a cross-sectional view is shown of a side 41a of the outer coil 41 located to the upper left of the Hall element 53 in FIG. 9 and a side 42a of the inner coil 42 located to the lower right of the Hall element 53 in FIG. 9. The Hall element 53 is mounted above the wiring portions 3 that form the same layer with the coil portion 4. Thus, the Hall element 53 is mounted at a position slightly offset from the coil portion 4 in the thickness direction (direction z) of the coil portion 4. This positions a magnetic sensitive surface 53a of the Hall element 53 at its position in FIG. 10.

The curved lines of FIG. 10 indicate contour lines indicating an equal magnitude of magnetic flux density, with the numerical values accompanying the contour lines indicating the magnitude of the magnetic flux density of the contour lines in Milliteslas (mT). The plus and minus of the numbers indicate the opposite magnetic flux directions. Also, in this example, the outer coil 41 and the inner coil 42 have a different winding number so that a state in which the magnetic flux density of 0 is formed at or near a central position between the side 41a of the outer coil 41 and the side 42a of the inner coil 42. However, instead of using different winding numbers, different current values may be applied to the coils. The magnetic flux generated by the outer coil 41 is concentrated with magnetic flux from three directions converging, whereas the magnetic flux generated by the inner coil 42 is mainly affected from one direction. Thus, the influence of the magnetic flux generated by the outer coil 41 is greater. Accordingly, to form a state in which the magnetic flux density is 0 at or near a central position between the side 41a of the outer coil 41 and the side 42a of the inner coil 42, the winding number of the outer coil 41 or the applied current value may be reduced relative to the inner coil 42.

According to the configuration of the present embodiment, noise entering to the Hall element 53 can be reduced by making the density of the magnetic flux generated by the current applied to the coil portion 4 as small as possible at the magnetic sensitive surface 53a of the Hall element 53.

Fifth Embodiment

A coil module A50 according to the fifth embodiment will now be described with reference to FIGS. 11 and 12. FIG.

11 is a perspective view illustrating the general configuration of the coil module A50. FIG. 12 is a diagram illustrating the density distribution of the magnetic flux generated by a current being applied to the coil around the magnetic detection element. The coil module A50 is different from the coil module A40 described above in terms of mainly the configuration of the coil portion 4 and the arrangement of the Hall element 53.

Figure 11:
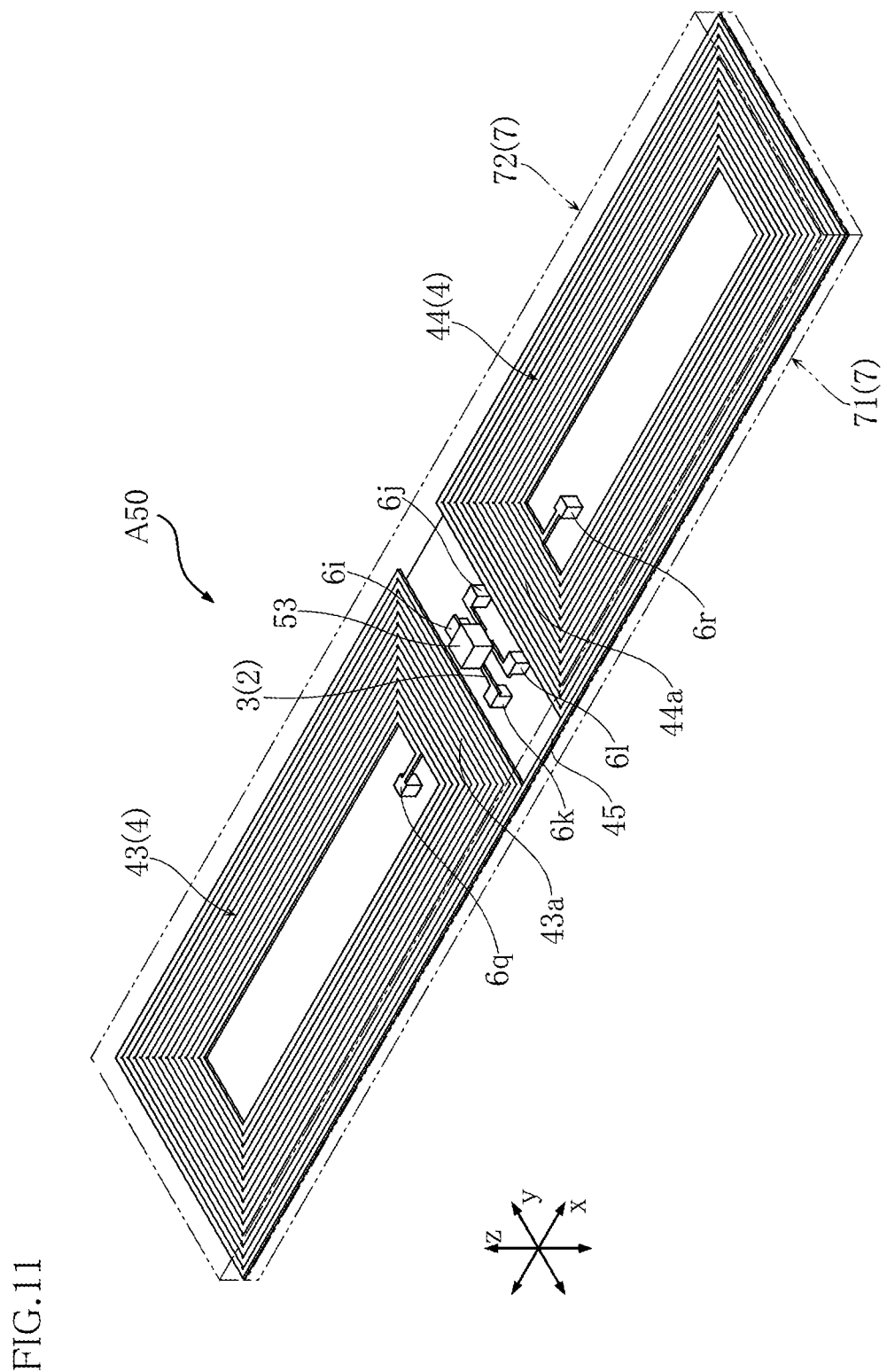
FIG. 11 is a perspective view illustrating a coil module according to a fifth embodiment.

In the present embodiment, the coil portion 4 includes a first coil 43 located on the left side of FIG. 11 and a second coil 44 located on the right side of FIG. 11. The first coil 43 and the second coil 44 are adjacent to one another as viewed in the direction z. The Hall element 53 is disposed between the first coil 43 and the second coil 44 as viewed in the direction z. If space is sufficient, the driver IC 51 with a built-in magnetic detection element may be mounted instead of the Hall element 53.

In the present embodiment, four wiring portions 3 are formed, and the Hall element 53 is mounted above the wiring portions 3. The configuration of the wiring portions 3 and the terminal portions 6i to 6j provided on the ends thereof is the same as that of the coil modules A30, A40.

In the present embodiment, the first coil 43 and the second coil 44 are connected in series via a connection portion 45 located between the first coil 43 and the second coil 44. The coil module A50 is provided with terminal portions 6q, 6r connected to the coil portion 4. The terminal portion 6q is provided on the end portion of the first coil 43. The terminal portion 6r is provided on the end portion of the second coil 44. The four terminal portions 6i to 6l connected to the Hall element 53 and the two terminal portions 6q, 6r connected to the coil portion 4 are connected to the flexible substrate on the actuator side.

The purpose of disposing the Hall element 53 (magnetic detection element) between the first coil 43 and the second coil 44 is to prevent the magnetic field generated by a current being applied to the coil portion 4 entering to the magnetic detection element and becoming noise. As illustrated in FIG. 12, the position where the magnetic flux density component is 0 is located at a position slightly offset from the coil portion 4 in the thickness direction (direction z) of the coil portion 4 on the central position line between the first coil 43 and the second coil 44. By disposing the magnetic sensitive surface 53a of the Hall element 53 at or near the position where the magnetic flux density component is 0, the magnetic flux density passing through the Hall element 53 can be reduced and noise can be reduced.

This will be described in further detail with reference to FIG. 12. FIG. 12 is a diagram schematically illustrating the density distribution of the magnetic flux generated by a current being applied to the coil at a central cross-section near the Hall element 53 (magnetic detection element). In FIG. 12, a cross-sectional view is shown of a side 43a of the first coil 43 located to the upper left of the Hall element 53 in FIG. 11 and a side 44a of the second coil 44 located to the lower right of the Hall element 53 in FIG. 11. Also, the Hall element 53 is mounted above the wiring portions 3 that form the same layer with the coil portion 4. Thus, the Hall element 53 is mounted at a position slightly offset from the coil portion 4 in the thickness direction (direction z) of the coil portion 4. This positions a magnetic sensitive surface 53a of the Hall element 53 at its position in FIG. 12.

Figure 12:
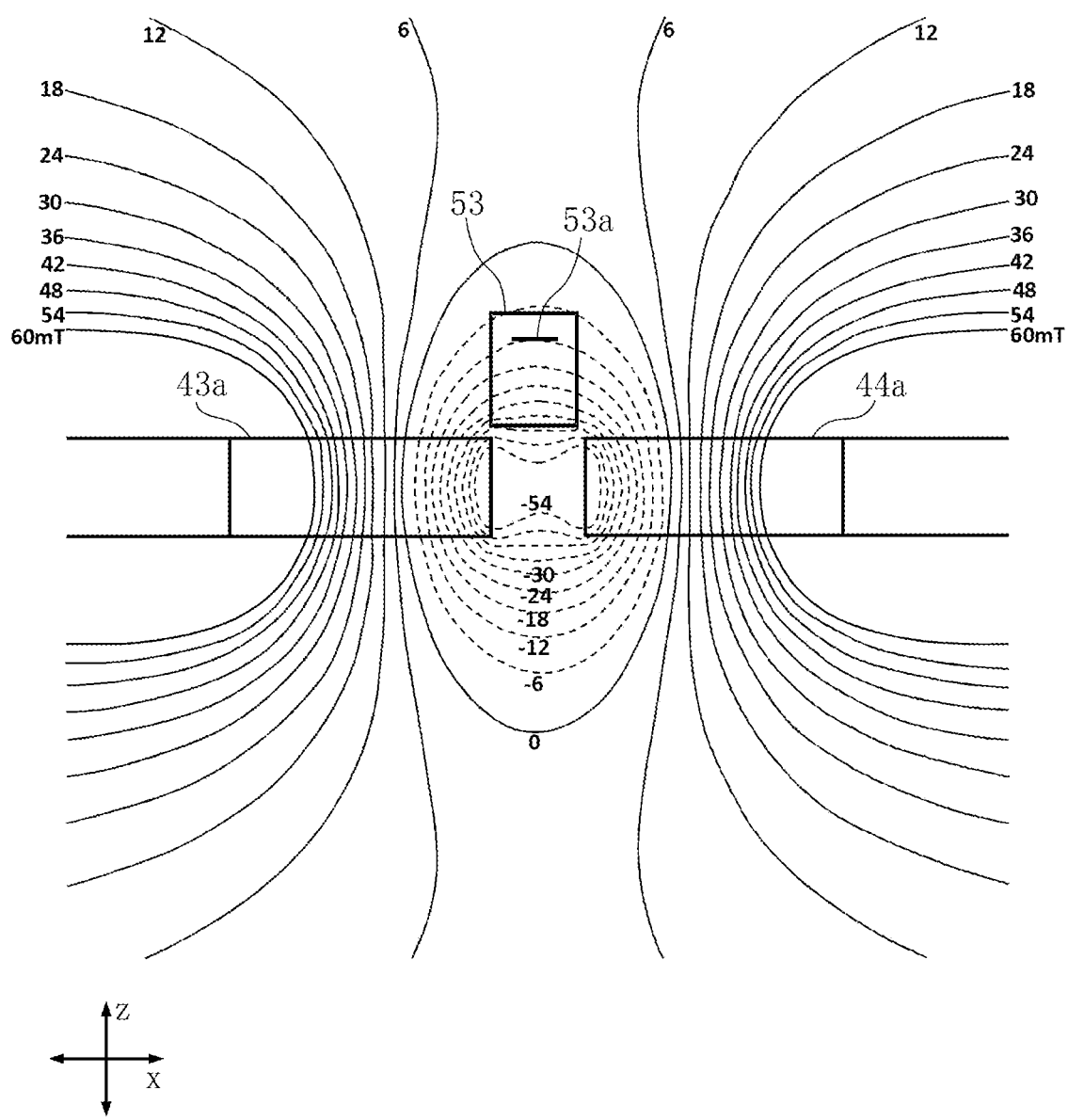
FIG. 12 is a diagram illustrating the distribution of the magnetic flux density around the magnetic detection element of the coil module illustrated in FIG. 11.

The curved lines of FIG. 12 indicate contour lines with an equal magnitude of magnetic flux density, with the numerical values accompanying the contour lines indicating the magnitude of the magnetic flux density of the contour lines in Milliteslas (mT). The plus and minus of the numbers indicate the opposite magnetic flux directions. As illustrated in FIG. 12, the magnetic flux density is relatively larger at the same position as the coil portion 4 in the thickness direction (direction z) of the coil portion 4 on the central position line between the two coils (the first coil 43 and the second coil 44), but the position where the magnetic flux density is roughly 0 is located at a position offset from the coil portion 4 in the thickness direction of the coil portion 4. By disposing the Hall element 53 so that the magnetic sensitive surface 53a of the Hall element 53 (magnetic detection element) is disposed at or near the position where the magnetic flux density is 0, unwanted noise entering the Hall element 53 can be reduced.

According to the configuration of the present embodiment, noise entering the Hall element 53 can be reduced by making the density of the magnetic flux generated by the current applied to the coil portion 4 as small as possible at the magnetic sensitive surface 53a of the Hall element 53.

Sixth Embodiment

Figure 13:
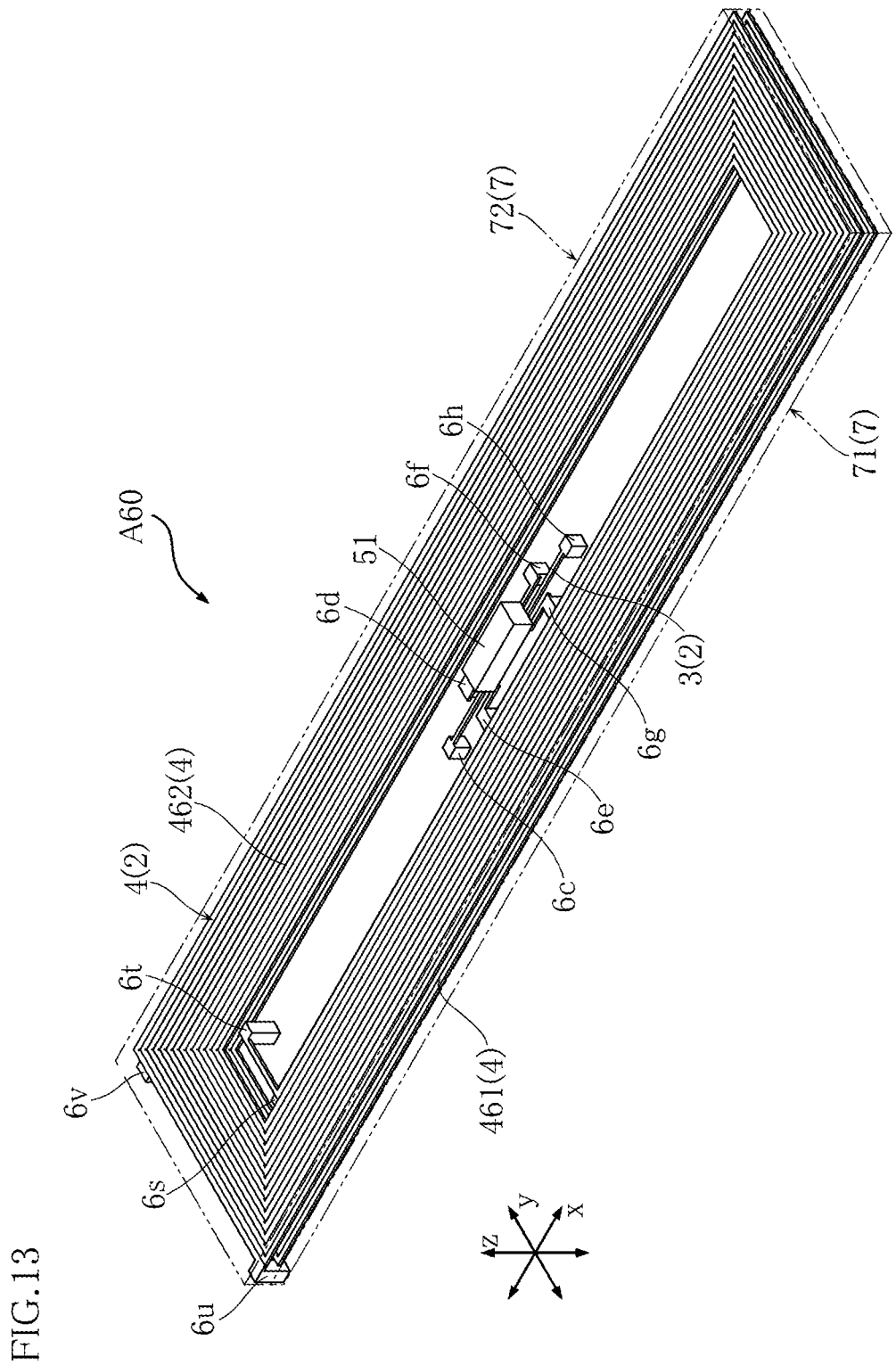
FIG. 13 is a perspective view illustrating a coil module according to a sixth embodiment.

A coil module A60 according to the sixth embodiment of the present disclosure will now be described with reference to FIG. 13. The coil module A60 is different from the coil module A10 described above in terms of mainly the configuration of the coil portion 4.

In the present embodiment, the coil portion 4 has a configuration in which a plurality of layers are stacked on one another with an interval therebetween. Specifically, the coil portion 4 includes a lower layer coil 461 and an upper layer coil 462. The lower layer coil 461 is formed on the first sealing resin 71. The upper layer coil 462 is disposed separated from the lower layer coil 461 by an interval in the thickness direction (direction z) of the sealing resin 7. When forming the coil portion 4, the lower layer coil 461 is formed on the first sealing resin 71, an intermediate insulating layer (not illustrated) is formed on this surface, then the upper layer coil 462 is formed on the intermediate insulating layer.

In the present embodiment, a plurality of terminal portions 6s, 6t, 6u, 6v are provided connected to the coil portion 4. Specifically, the terminal portions 6s, 6v are provided on the two ends of the lower layer coil 461. The terminal portions 6t, 6u are provided on the two ends of the upper layer coil 462. The terminal portions 6t, 6u pass through the intermediate insulating layer and project to the lower layer side. The wiring portions 3 for mounting the driver IC 51 (element) is formed in the same layer as the lower layer coil 461. In the present embodiment, there are six wiring portions 3, with the terminal portions 6c to 6h being connected to the ends of the wiring portions 3. The other end of each one of the wiring portions 3 is connected to a terminal of the driver IC 51.

The sealing resin 7 covers the majority of the terminal portions 6c to 6h and 6s to 6v except for the ends. The ends of the terminal portions 6c to 6h and 6s to 6v are exposed on the bottom surface side of the sealing resin 7. In the sealing resin 7, the surface on the side where the terminal portions 6c to 6h and 6s to 6v are exposed corresponds to the mounting surface for mounting on the flexible substrate on the actuator side, for example. The terminal portions are, depending on their purpose, connected to one another via a wiring pattern inside the flexible substrate.

According to the present embodiment, because the coil portion 4 has a multilayer configuration including a plurality of layers (the lower layer coil 461 and the upper layer coil 462), the (total) number of coils of the coil portion 4 can be increased. Thus, the drive power when the coil module A60 utilizes the actuator can be increased.

Seventh Embodiment

Figure 14:
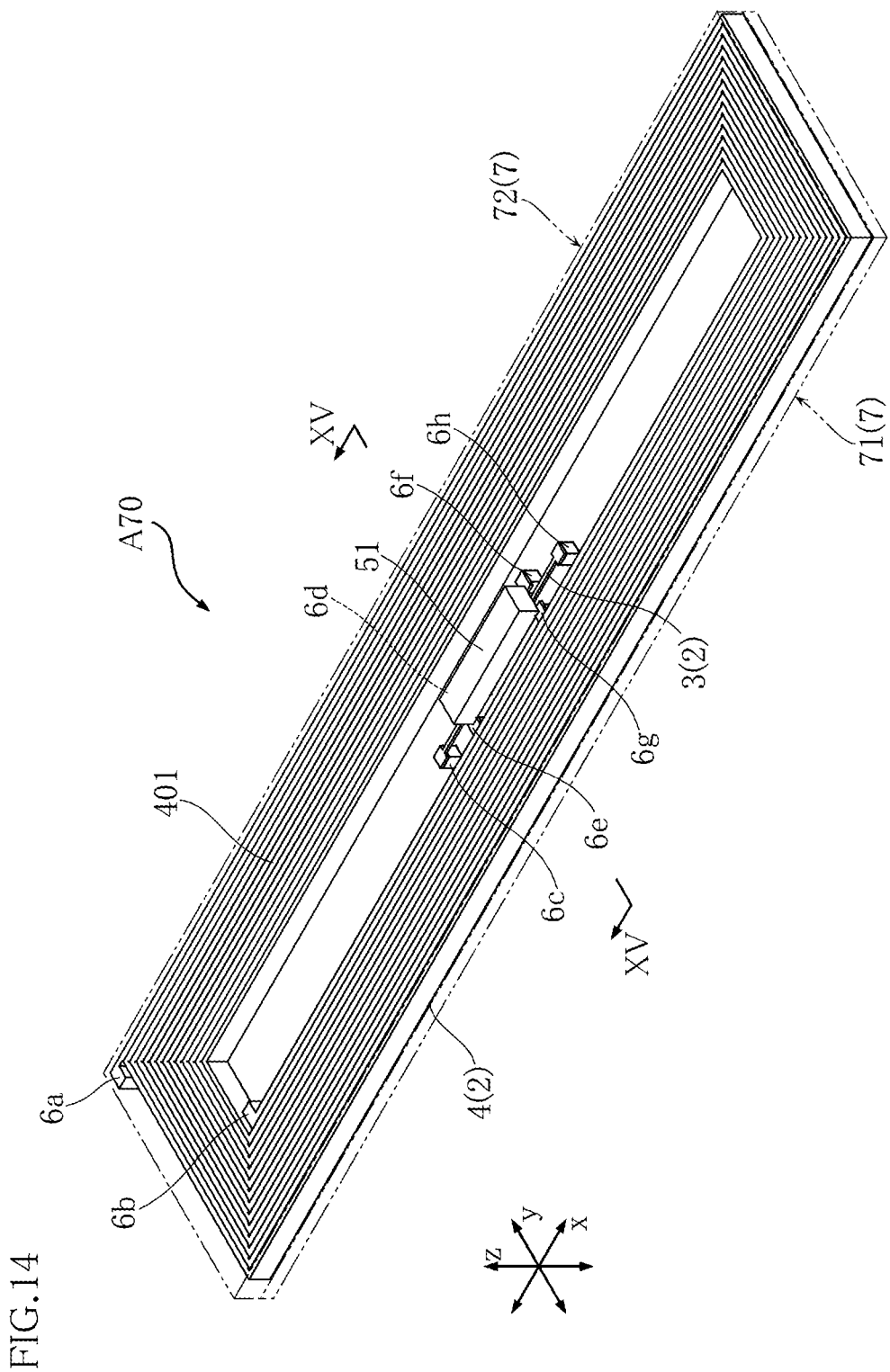
FIG. 14 is a perspective view illustrating a coil module according to a seventh embodiment.
Figure 15:
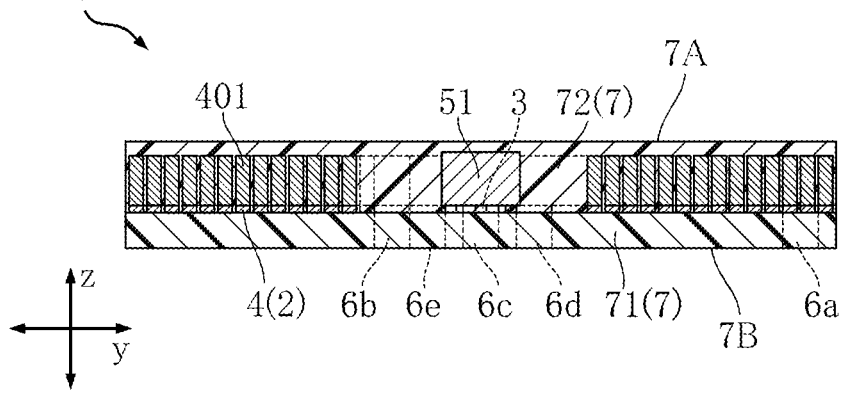
FIG. 15 is a cross-sectional view taken along line XV-XV of FIG. 14.

A coil module A70 according to the seventh embodiment will now be described with reference to FIGS. 14 and 15. FIG. 14 is a perspective view illustrating the general configuration of the coil module A70. FIG. 15 is a cross-sectional view taken along line XV-XV of FIG. 14. The coil module A70 is different from the coil module A10 described above in that an additional coil 401 is further provided.

In the present embodiment, the additional coil 401 is connected to the coil portion 4 and formed on the coil portion 4. The additional coil 401 extends in the thickness direction (direction z) of the sealing resin 7 and overlaps with the coil portion 4 as viewed in the direction z. Also, the additional coil 401 overlaps with at least a portion of the driver IC 51 as viewed in a direction along the x-y plane. The thickness (dimension in the direction z) of the additional coil 401 is sufficiently greater than the thickness of the coil portion 4, but set so that the end of the additional coil 401 is not exposed from the sealing resin 7. The additional coil 401 made of Cu is formed by electrolytic plating using the coil portion 4, for example.

According to the present embodiment, the thickness of the entire coil including the coil portion 4 and the additional coil 401 can be efficiently increased, which allows resistance to be decreased and the amount of heat generated to be decreased.

Modified Example of Seventh Embodiment

Figure 16:
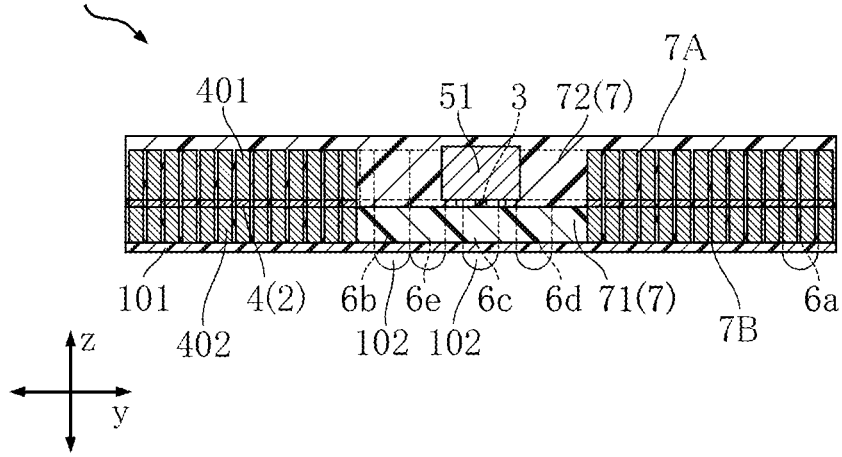
FIG. 16 is a cross-sectional view similar to FIG. 15 illustrating a coil module according to a modified example of the seventh embodiment.

A coil module A71 according to a modified example of the coil module A70 will be described next with reference to FIG. 16. The coil module A71 is different from the coil module A70 described above mainly in that an additional coil 402 is further provided.

The additional coil 402 is connected to the coil portion 4 and located on the opposite side of the coil portion 4 from the additional coil 401. The additional coil 402 extends in the thickness direction (direction z) of the sealing resin 7 and overlaps with the coil portion 4 as viewed in the direction z. The thickness (dimension in the direction z) of the additional coil 402 is sufficiently greater than the thickness of the coil portion 4. The additional coil 402 is formed by patterning of the conductive layer 6' using the method of manufacturing the coil module A10 described with reference to FIG. 5, for example. With the patterning of the conductive layer 6', the additional coil 402 and the plurality of terminal portions 6a to 6h can be collectively formed.

In the present modified example, an insulating film 101 is formed on the bottom surface 7B of the sealing resin 7 (first sealing resin 71). The insulating film 101 is a solder resist film, for example, that covers the end of the additional coil 402. However, in the insulating film 101, openings are formed at portions corresponding to the terminal portions 6a to 6h. Through these openings, solder balls 102 connected to the terminal portions 6a to 6h are formed. The coil module A71, for example, is mounted on the flexible substrate on the actuator side via the solder balls 102. Note that when mounting the coil module A71, the coil module A71 may be mounted on the flexible substrate using solder balls, solder paste, or the like without the solder balls 102 being provided.

According to the present embodiment, the thickness of the entire coil including the coil portion 4, the additional coil 401, and the additional coil 402 can be efficiently increased, which allows resistance to be decreased and the amount of heat generated to be decreased.

Another Modified Example of Seventh Embodiment

Figure 17:
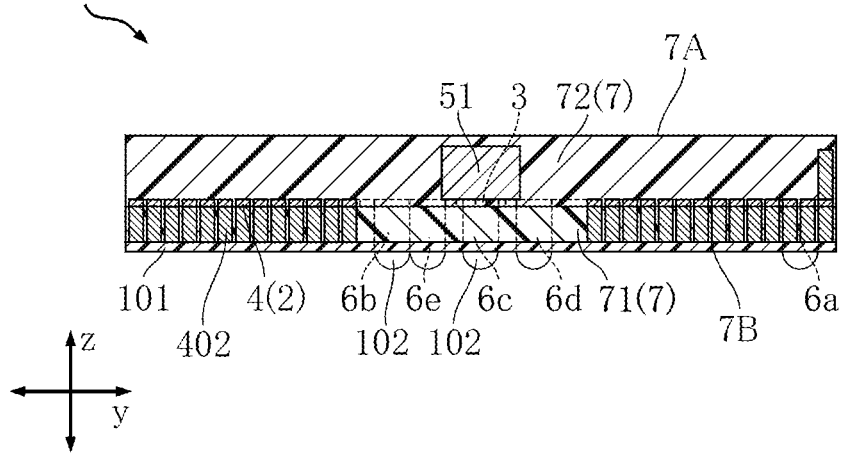
FIG. 17 is a cross-sectional view illustrating a coil module according to another modified example of the seventh embodiment.

A coil module A72 according to another modified example of the coil module A70 will be described next with reference to FIG. 17. The coil module A72 is different from the coil module A70 described above mainly in that the additional coil 402 is provided. However, the difference from the coil module A70 is that the additional coil 401 is not provided.

The configuration of the additional coil 402 of the present modified example is the same as that of the additional coil 402 of the coil module A71. Also, in the present modified example, the same insulating film 101 and the solder balls 102 as in the coil module A71 are provided.

According to the present embodiment, the thickness of the entire coil including the coil portion 4 and the additional coil 402 can be efficiently increased, which allows resistance to be decreased and the amount of heat generated to be decreased.

Eighth Embodiment

Figure 18:
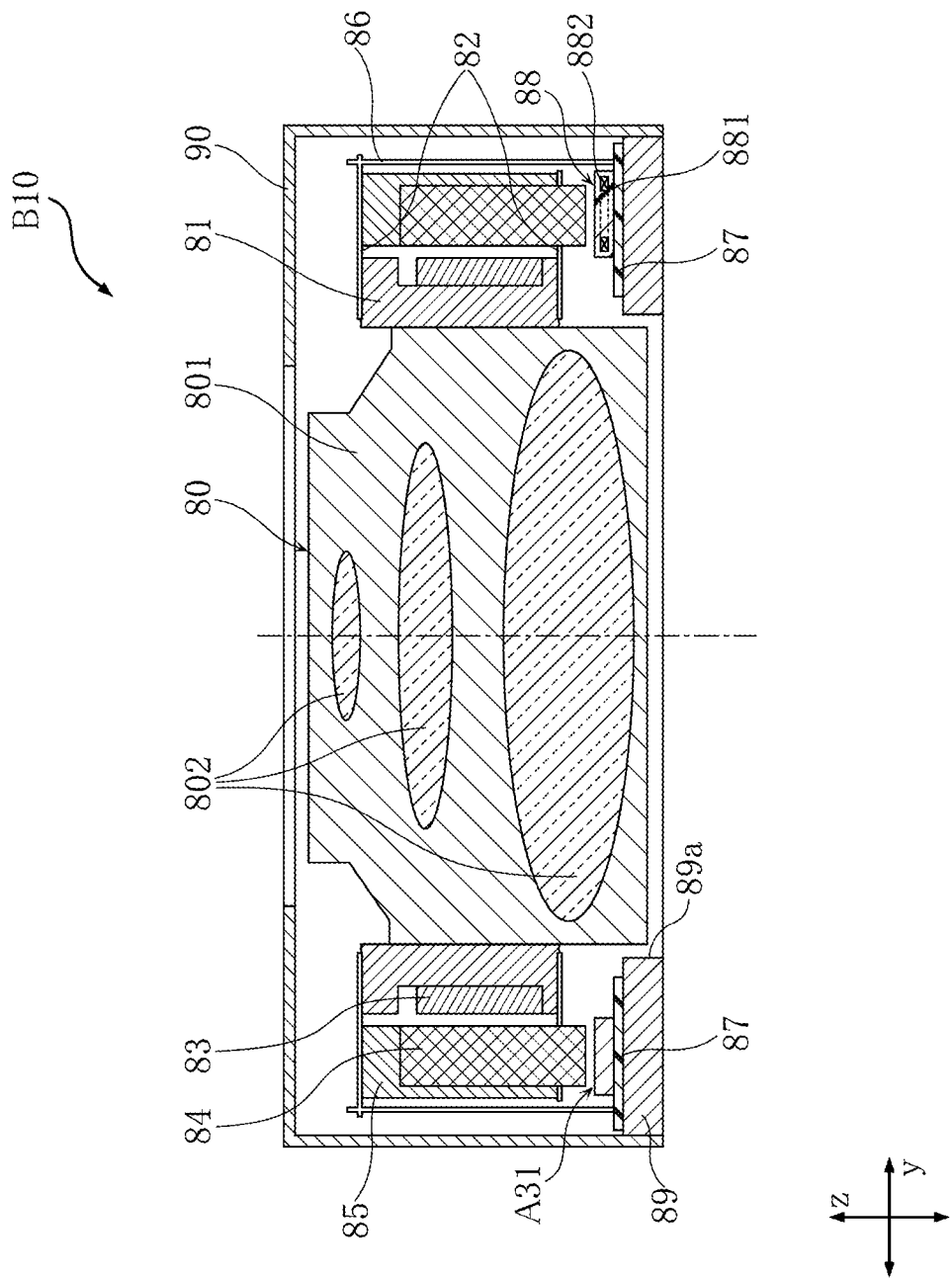
FIG. 18 is a cross-sectional view illustrating an actuator according to an eighth embodiment.
Figure 19:
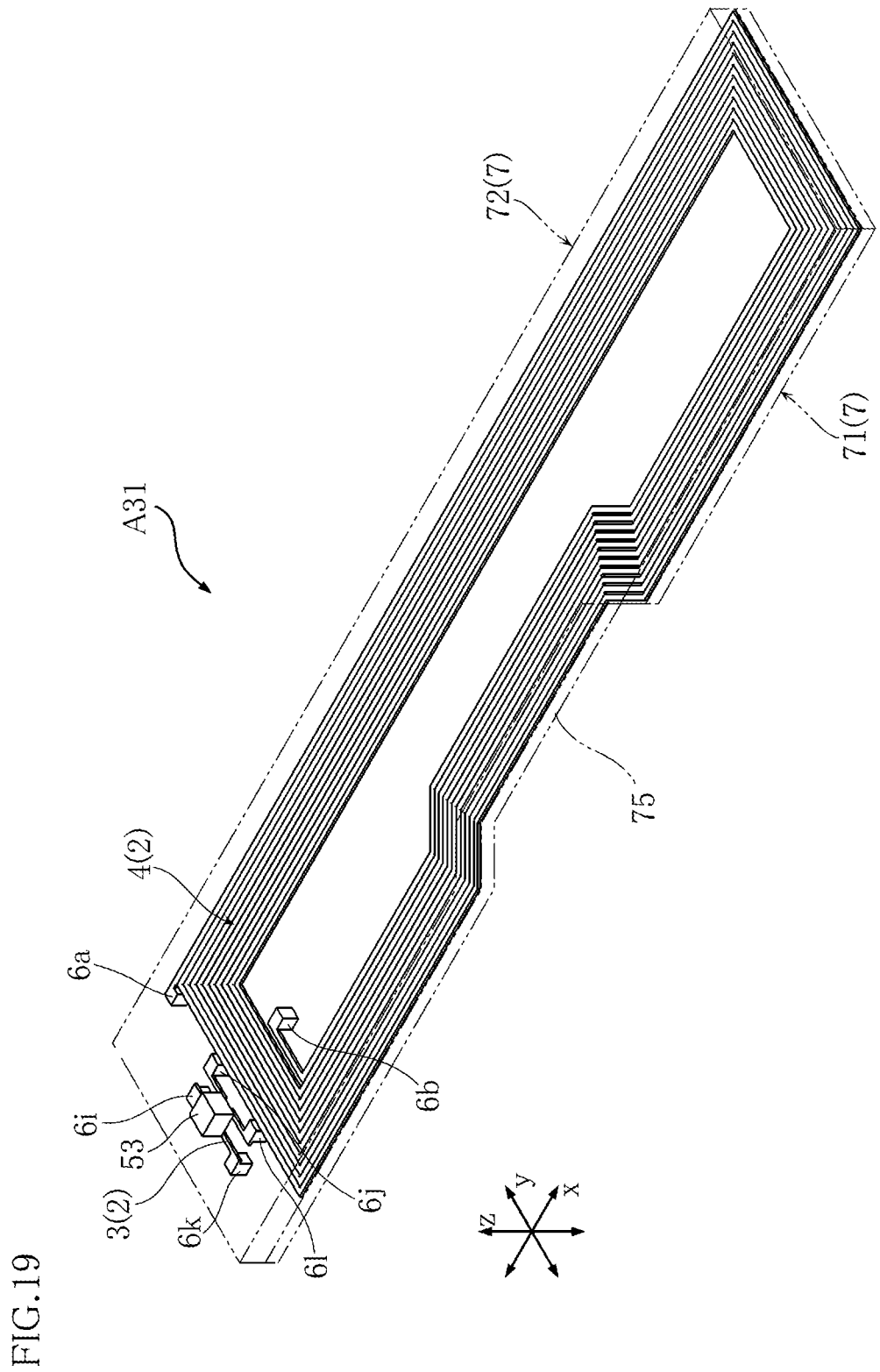
FIG. 19 is a perspective view illustrating a coil module suitable for use in the actuator illustrated in FIG. 18.
Figure 20:
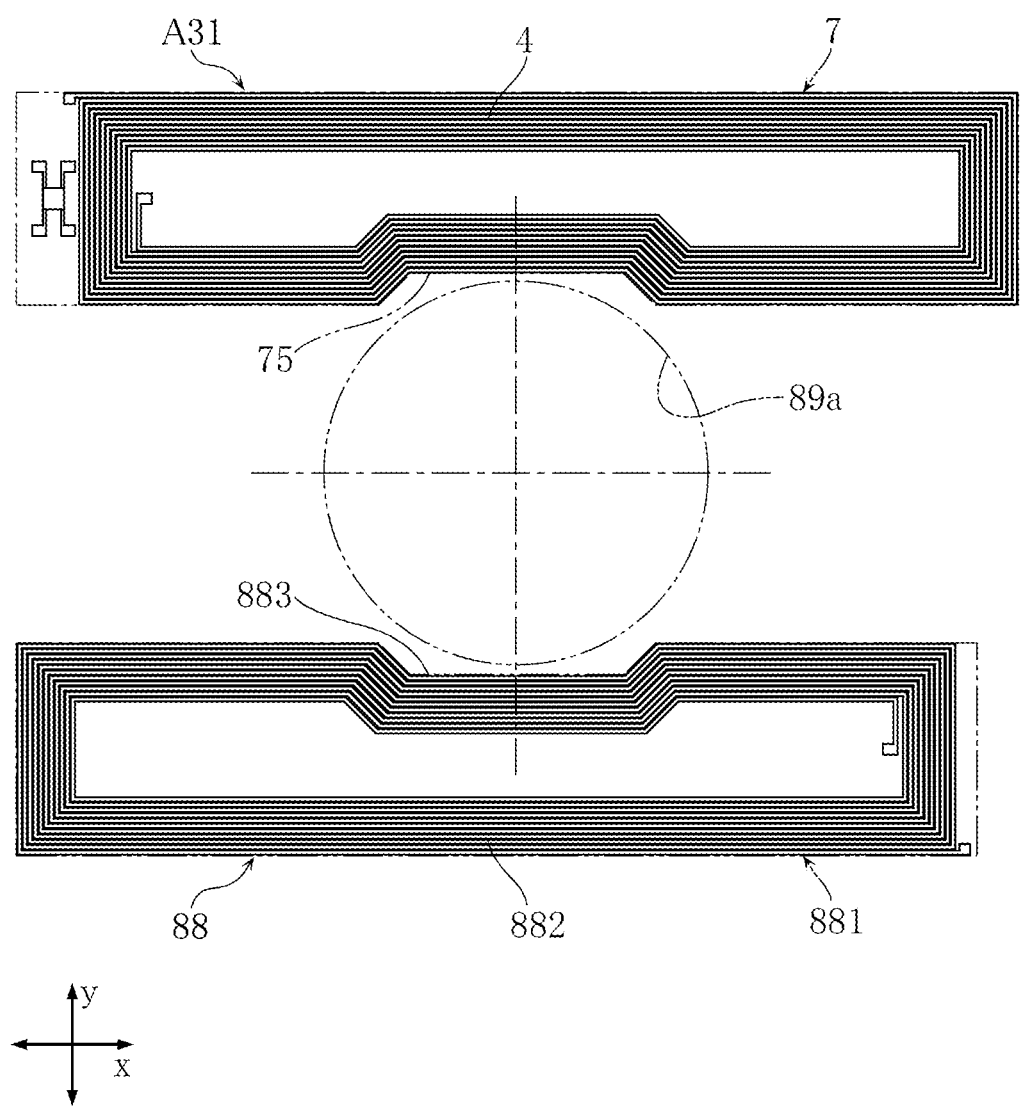
FIG. 20 is a plan view illustrating an example of an arrangement of the coil module illustrated in FIG. 19 and another coil component.

A case in which the coil module of the present disclosure is used in an actuator will now be described with reference to FIGS. 18 to 20. FIG. 18 is a central cross-sectional view illustrating the schematic configuration of an actuator B10 according to the eighth embodiment. FIG. 19 is a perspective view illustrating the schematic configuration of a coil module A31 suitable for use in the actuator B10 illustrated in FIG. 18. FIG. 20 is a plan view of a configuration suitable for use in the actuator B10 illustrated in FIG. 18 in which, in addition to the coil module A31 of FIG. 19, a coil component formed of only coils and not elements is disposed.

The actuator B10 illustrated in FIG. 18 is used to drive a lens or the like in a camera module, for example. However, the present disclosure is not limited thereto, and it may be used to drive another component in another application. In the example described below, the actuator is used in a camera module for autofocus (AF) and hand shake correction (OIS) in particular. An image capturing lens 80 of the camera module includes a lens barrel 801 and a plurality of lens bodies 802. In the illustrated example, there are three lens bodies 802, however the number of lens bodies 802 used is not limited thereto.

The actuator B10 is provided with the coil module A31 as well as a lens holder 81, a leaf spring 82, an AF coil 83, a permanent magnet 84, a magnet holder 85, a suspension wire 86, a flexible substrate 87, a coil component 88, a base 89, a cover 90, and the like.

The lens holder 81 holds the image capturing lens 80. The lens holder 81 and the lens barrel 801 are attached after the height adjustment of the image capturing lens 80. The AF coil 83 is wound around the outer peripheral surface of the lens holder 81. The permanent magnet 84 is disposed opposing the AF coil 83. The permanent magnet 84 is fixed to the magnet holder 85, and by applying a current to the AF coil 83, an electromagnetic force (Lorentz force) acts between the AF coil 83 and the permanent magnet 84, with the AF coil 83 receiving a force in the optical axis direction. The lens holder 81 is supported by two plates of the leaf spring 82 in a manner allowing it to move in the optical axis direction relative to the magnet holder 85. The image capturing lens 80, the lens holder 81, the AF coil 83, and the like form an AF movable portion.

The flexible substrate 87 is attached to the base 89. The cover 90 is provided with a hole for ensuring an optical path in the top surface and covers the internal components of the actuator B10. The base 89 and the cover 90 are integrally connected. Because the permanent magnet 84 is located in an OIS movable portion, the material of the cover 90 is preferably a non-magnetic metal (for example, a copper alloy such as nickel silver). The base 89 is provided with an opening 89a in a central portion, with a portion of the image capturing lens 80 located therein.

On the flexible substrate 87, the coil module A31 and the coil component 88 are disposed opposing the permanent magnet 84. The coil module A31 is integrally packaged with the Hall element 53 that functions as a magnetic detection element and the coil portion 4 that functions as an OIS coil. The coil component 88 is disposed as a pair with the coil module A31 separated from the coil module A31 in the direction y on either side of the opening 89a of the base 89. In a case where the coil module A31 and the coil component 88 illustrated in FIG. 18 are for position detection and driving in the direction y, another coil module and coil component for position detection in the direction x (the direction perpendicular to the paper surface of FIG. 18) are disposed at a non-illustrated position.

The coil module A31 illustrated in FIG. 19 has a configuration similar to that of the coil module A30 described above, except that an indent 75 is formed in the sealing resin 7. Depending on the design of the actuator B10, a trapezoidal-shaped indent 75 is provided to ensure an appropriate gap with the image capturing lens 80. In the coil module A31, for example, the coil portion 4 is formed conforming to the shape of the indent 75.

The coil component 88 illustrated in FIGS. 18 and 20 may have the configuration of the coil module A31 except with the Hall element 53 and the terminal portion for the element removed. For example, the coil component 88 is formed via patterning of an OIS coil 882 inside a resin package 881. As illustrated in FIG. 20, also in the resin package 881 of the coil component 88, a trapezoidal-shaped indent 883 similar to that in the sealing resin 7 of the coil module A31 is provided, and the coil component 88 and the coil module A31 are disposed at symmetrical positions on either side of the opening 89a of the base 89. By disposing the coil module A31 and the coil component 88 using the trapezoidal-shaped indents 75, 883 in this manner, even the space near the opening 89a of the base 89 can be effectively utilized.

The trapezoidal-shaped indent 75 described above, for example, is formed as a trapezoidal-shaped indent in a substrate material corresponding to the base material when the coil module A31 is manufactured, and the sealing resin is layered above this.

As illustrated in FIG. 18, a portion of the leaf spring 82 located on the upper side projects out past the magnet holder 85, with this projection portion being connected with the upper end of the suspension wire 86. The lower end of the suspension wire 86 is connected to the flexible substrate 87, and the terminal of the AF coil 83 is electrically connected to the flexible substrate 87 via the leaf spring 82 (upper side) and the suspension wire 86. The suspension wire 86 supports the magnet holder 85 in a manner allowing it to move in the direction perpendicular to the optical axis. The magnet holder 85, the permanent magnet 84, the AF movable portion, and the like form the OIS movable portion.

As described above, the coil module A31 and the coil component 88 are disposed opposing the permanent magnet 84 above the flexible substrate 87. When a current is applied to the coil portion 4 inside the coil module A31 and the OIS coil 882 of the coil component 88, an electromagnetic force (Lorentz force) acts between them and the permanent magnet 84, and the coil portion 4 and the OIS coil 882 receive a force in the direction perpendicular to the optical axis. The coil module A31 including the coil portion 4 and the coil component 88 including the OIS coil 882 are fixed to the flexible substrate 87. Accordingly, the permanent magnet 84 receives a force in the direction perpendicular to the optical axis as a reaction to the Lorentz force. Then, due to the configuration of the OIS movable portion described above, the permanent magnet 84 moves in the direction perpendicular to the optical axis. The coil module A31 is provided with the Hall element 53. The Hall element 53 detects the change in the magnetic flux (component in the direction z in the diagram) caused by the movement of the permanent magnet 84 and performs position detection on the basis of this.

The control of the hand shake correction (OIS) is performed via feedback control of the procedure described below, for example. First, the angle of the hand shake is detected by a non-illustrated gyro sensor (angular velocity sensor), and the movement amount (target movement amount) the OIS movable portion (the permanent magnet 84, the magnet holder 85, and the image capturing lens 80 supported thereby) needs to be moved in the direction perpendicular to the optical axis is obtained. Next, a current based on the target movement amount for the OIS movable portion is applied to the coil portion 4 and the OIS coil 882. Then, the actual movement amount (measured movement amount) of the OIS movable portion is detected from a detection signal of the Hall element 53. In a case where there is a difference in values between the measured movement amount and the target movement amount, the current applied to the coil portion 4 and the OIS coil 882 is adjusted.

According to the actuator B10 of the present embodiment, the permanent magnet 84 has three functions: driving the AF, driving the OIS, and detecting the position of the OIS. By using the permanent magnet 84 for both driving and position detection in this manner, the number of parts of the actuator B10 can be reduced.

As can be understood from the foregoing description, the coil module of the present disclosure is suitable to be used installed in an actuator in a camera module, for example. The coil module of the present disclosure is easily handled when mounted in an actuator usage, and can maintain the positional relationship between the coil portion and the element with high accuracy. Also, a coil module can be provided that can suppress warpage caused by a difference in the thermal expansion coefficient of resin materials and that can reduce contraction strain in the sealing resin when the resin is cured.

Embodiments of the present disclosure have been described above. However, the present disclosure is not limited thereto, and various changes can be made. The specific configuration of the coil module and the actuator according to the present disclosure has many areas where changes can be made depending on the design.

The present disclosure includes the configurations presented below.

Clause 1.

A coil module comprising:
 a conductor layer formed along a predetermined plane and including a wiring portion and a helical-shaped coil portion;
 at least one element mounted on the wiring portion; and a sealing resin that covers the conductor layer and the at least one element, the sealing resin being integrally formed of a single type of resin material and having a predetermined thickness in a first direction perpendicular to the plane.

Clause 2.

The coil module according to Clause 1, wherein the at least one element includes a magnetic detection element.

Clause 3.

The coil module according to Clause 2, wherein the at least one element includes a driver IC, and the magnetic detection element is built in the driver IC.

Clause 4.

The coil module according to Clause 3, wherein the driver IC and the coil portion are electrically connectable via the wiring portion.

Clause 5.

The coil module according to any one of Clauses 2 to 4, wherein the at least one element includes a chip capacitor.

Clause 6.

The coil module according to any one of Clauses 2 to 5, wherein the at least one element is disposed inside of the coil portion as viewed in the first direction.

Clause 7.

The coil module according to any one of Clauses 2 to 5, wherein the at least one element is disposed outside of the coil portion as viewed in the first direction.

Clause 8.

The coil module according to any one of Clauses 2 to 5, wherein the coil portion includes an outer coil and an inner coil located inside of the outer coil as viewed in the first direction, and
 the at least one element is disposed outside of the outer coil and outward from the inner coil as viewed in the first direction.

Clause 9.

The coil module according to any one of Clauses 2 to 5, wherein the coil portion includes a first coil and a second coil connected in series and located adjacent to one another as viewed in the first direction, and
 the at least one element is disposed between the first coil and the second coil as viewed in the first direction.

Clause 10.

The coil module according to any one of Clauses 1 to 9, wherein the coil portion has a multilayer configuration including a plurality of layers separated by an interval in the first direction.

Clause 11.

The coil module according to any one of Clauses 1 to 10, further including a plurality of terminal portions, each one of the terminal portions being electrically connected to the wiring portion or the coil portion and being exposed from the sealing resin.

Clause 12.

The coil module according to any one of Clauses 1 to 11, further comprising an additional coil connected to the coil portion, the additional coil extending in the first direction and overlapping with the coil portion as viewed in the first direction.

Clause 13.

The coil module according to Clause 12, wherein the additional coil overlaps with at least a portion of the at least one element as viewed along a direction parallel with the plane.

Clause 14.

An actuator comprising:
 a coil module according to any one of Clauses 1 to 13; and
 a magnetic field generator disposed opposing the coil module,
 wherein the coil module and the magnetic field generator are moveable relative to one another.

Clause 15.

A method of manufacturing a coil module, the method comprising:
 forming a first sealing resin on a surface of a substrate material;
 forming a conductor layer including a wiring portion and a helical-shaped coil portion on the first sealing resin;
 mounting at least one element on the wiring portion;
 forming a second sealing resin including a resin material of a similar type to that of the first sealing resin on the first sealing resin, covering the conductor layer and the at least one element; and
 removing the substrate material.

Clause 16.

The method of manufacturing a coil module according to Clause 15, further comprising forming a plurality of terminal portions including conductors on the substrate material before forming the first sealing resin.

LIST OF REFERENCES

A10, A20, A30, A31, A40 Coil module
A50, A60, A70, A71, A72 Coil module
B10 Actuator
1 Substrate material
101 Insulating film
102 Solder ball
11 Insulating layer
2 Conductor layer
2' Conductor layer
3 Wiring portion
4 Coil portion
4a, 4b Portion
401 Additional coil
402 Additional coil
41 Outer coil
41a Side
42 Inner coil
42a Side
43 First coil
43a Side
44 Second coil
44a Side
45 Connection portion
461 Lower layer coil
462 Upper layer coil
51 Driver IC
52 Chip capacitor
53 Hall element
53a Magnetic sensitive surface
6, 6a to 6v Terminal portion
6' Conductive layer
61 Mask layer
7 Sealing resin
7A Top surface
7B Bottom surface
71 First sealing resin
72 Second sealing resin
75 Indent
80 Image capturing lens
801 Lens barrel
802 Lens body
81 Lens holder 82 Leaf spring
83 AF coil
84 Permanent magnet
85 Magnet holder
86 Suspension wire
87 Flexible substrate
88 Coil component
881 Resin package
882 OIS coil
883 Indent
89 Base
89a Opening
Cover
x Direction
y Direction
z Direction

The invention claimed is:

1. A coil module comprising:
a conductor layer formed along a predetermined plane and including a wiring portion and a coil portion;
at least one element mounted on the wiring portion;
a first sealing resin;
a second sealing resin disposed on the first sealing resin in a first direction perpendicular to the plane; and
a plurality of terminal portions,
wherein the conductor layer is disposed on a surface of the first sealing resin that faces the second sealing resin,
the second sealing resin covers the conductor layer and the at least one element, the second sealing resin being integrally formed of a single type of resin material and having a predetermined thickness in the first direction,
each one of the terminal portions is electrically connected to the wiring portion or the coil portion and extends through the first sealing resin in the first direction to be exposed from a side of the first sealing resin that is opposite from the second sealing resin, and
the wiring portion and the coil portion are disposed at a same position in the first direction.

2. The coil module according to claim 1, wherein the at least one element includes a magnetic detection element.

3. The coil module according to claim 2, wherein the at least one element includes a driver IC, and the magnetic detection element is built in the driver IC.

4. The coil module according to claim 3, wherein the driver IC and the coil portion are electrically connectable via the wiring portion.

5. The coil module according to claim 2, wherein the at least one element includes a chip capacitor.

6. The coil module according to claim 2, wherein the at least one element is disposed inside of the coil portion as viewed in the first direction.

7. The coil module according to claim 2, wherein the at least one element is disposed outside of the coil portion as viewed in the first direction.

8. The coil module according to claim 2, wherein the coil portion includes an outer coil and an inner coil located inside of the outer coil as viewed in the first direction, and
the at least one element is disposed inside of the outer coil and outward from the inner coil as viewed in the first direction.

9. The coil module according to claim 2, wherein the coil portion includes a first coil and a second coil connected in series and located adjacent to one another as viewed in the first direction, and
the at least one element is disposed between the first coil and the second coil as viewed in the first direction.

10. The coil module according to claim 1, wherein the coil portion has a multilayer configuration including a plurality of layers separated by an interval in the first direction.

11. The coil module according to claim 1, further comprising an additional coil connected to the coil portion, the additional coil extending in the first direction and overlapping with the coil portion as viewed in the first direction.

12. The coil module according to claim 11, wherein the additional coil overlaps with at least a portion of the at least one element as viewed along a direction parallel with the plane.

13. An actuator, comprising:
a coil module according to claim 1; and
a magnetic field generator disposed opposing the coil module,
wherein the coil module and the magnetic field generator are movable relative to one another.

14. A method of manufacturing the coil module of claim 1, the method comprising:
forming the first sealing resin on a surface of a substrate material;
forming the conductor layer including the wiring portion and the coil portion on the surface of the first sealing resin in a manner such that the wiring portion and the coil portion are disposed at a same position in a first direction perpendicular to the surface of the first sealing resin;
mounting the at least one element on the wiring portion;
forming the second sealing resin including a resin material of a similar type to that of the first sealing resin on the surface of the first sealing resin, covering the conductor layer and the at least one element; and
removing the substrate material.

15. The method according to claim 14, further comprising forming the plurality of terminal portions on the substrate material before forming the first sealing resin.

* * * * *